(12) United States Patent
Akiyama

(10) Patent No.: US 8,076,172 B2
(45) Date of Patent: Dec. 13, 2011

(54) METHOD OF MANUFACTURING SOLID-STATE IMAGING DEVICE AND METHOD OF MANUFACTURING ELECTRONIC APPARATUS

(75) Inventor: Kentaro Akiyama, Kanagawa (JP)

(73) Assignee: Sony Corporation, Tokyo (JP)

( * ) Notice: Subject to any disclaimer, the term of this patent is extended or adjusted under 35 U.S.C. 154(b) by 87 days.

(21) Appl. No.: 12/463,791

(22) Filed: May 11, 2009

(65) Prior Publication Data

US 2009/0280596 A1 Nov. 12, 2009

(30) Foreign Application Priority Data

May 12, 2008 (JP) ................................. 2008-125189

(51) Int. Cl.
*H01L 21/00* (2006.01)
(52) U.S. Cl. ................ 438/70; 438/73; 438/69; 438/57; 257/E31.127; 257/E21.001; 257/462; 257/620
(58) Field of Classification Search ..................... 438/70, 438/57, 69, 73; 257/432, E31, E31.127, 257/E21.001
See application file for complete search history.

(56) References Cited

U.S. PATENT DOCUMENTS

| 2006/0091398 | A1* | 5/2006 | Yamaguchi et al. | ............ 257/72 |
| 2008/0048280 | A1* | 2/2008 | Tsukamoto | ................... 257/432 |
| 2009/0136174 | A1* | 5/2009 | Itahashi | .......................... 385/14 |
| 2009/0242741 | A1* | 10/2009 | Konishi | ................... 250/214 A |
| 2010/0187648 | A1* | 7/2010 | Hashimoto | .................... 257/432 |

FOREIGN PATENT DOCUMENTS

| JP | 2005-347707 | 12/2005 |
| JP | 2005-353631 | 12/2005 |

\* cited by examiner

*Primary Examiner* — Jack Chiang
*Assistant Examiner* — Wilner Jean Baptiste
(74) *Attorney, Agent, or Firm* — SNR Denton US LLP

(57) ABSTRACT

A method of manufacturing a solid-state imaging device, where a signal circuit is formed on an insulating interlayer on a first side of a semiconductor substrate in which a photoelectric conversion part is formed and light is incident on the photoelectric conversion part from a second side thereof. The method includes the steps of: forming an on-chip color filter and an on-chip microlens on the second side where light is incident; and forming an opening in a pad part on the second side where light is incident.

9 Claims, 16 Drawing Sheets

METHOD OF MANUFACTURING SOLID-STATE IMAGING DEVICE AND METHOD OF MANUFACTURING ELECTRONIC APPARATUS

BACKGROUND OF THE INVENTION

1. Field of the Invention

The present invention relates to a method of manufacturing a solid-state imaging device, particularly a method of forming a pad part for leading out an electrode in the solid-state imaging device. The present invention also relates to a method of manufacturing an electronic apparatus using such a solid-state imaging device.

2. Description of the Related Art

Among solid-state imaging devices, specifically CMOS solid-state imaging devices, backside-illuminated solid-state imaging devices have been proposed for improving photoelectric conversion efficiency and sensitivity to incident light (see Japanese Unexamined Patent Application Publication No. 2005-353631, Japanese Unexamined Patent Application Publication No. 2005-347707, and Japanese Unexamined Patent Application Publication No. 2005-363955). The backside-illuminated solid-state imaging device includes photodiodes that serve as photoelectric conversion parts on a semiconductor substrate. In addition, the device includes pixel transistors, a plurality of wiring layers, and so on, constituting a signal circuit on the front side of the semiconductor substrate, while receiving incident light from the backside thereof.

In the backside-illuminated solid-state imaging device, a pad part is provided on the backside of the semiconductor substrate to supply necessary electric potentials to the plurality of wiring layers on the front side of the semiconductor substrate. FIG. 1 is a schematic cross-sectional view of the main part of the backside-illuminated solid-state imaging device. FIG. 1 illustrates the cross section of an area on the backside of the backside-illuminated solid-state imaging device, including a pad part 60 formed on the periphery thereof.

A backside-illuminated solid-state imaging device 70 includes an imaging region and peripheral circuits on a semiconductor substrate (for example, a monocrystal silicon layer) 53. The imaging region includes a plurality of pixels each having a photodiode (PD) 54 as a photoelectric conversion part and a plurality of pixel transistors (MOS transistors). In addition, the peripheral region on the backside of the semiconductor substrate includes a pad part connected to a necessary wiring of a plurality of wiring layers, or a so-called electrode lead-out pad part 60. The pixel transistors in the pixel are formed on the surface of the semiconductor substrate 53 but not shown in the figure. Furthermore, on the front side of the semiconductor substrate 53, a plurality of wiring layers 51, which is constructed of layers of wirings 52 [521, 522, and 523], is formed on an insulating interlayer 50. In this example, a first-layer wiring 521, a second-layer wiring 522, and a third-layer wiring 523 are formed. Any of these wiring layers may be made of Cu wiring, Al wiring, or the like. At least a wiring 521a facing the pad part 60 is made of Al wiring. A supporting substrate 61, such as a silicon substrate, is adhered on the front side of the plurality of wiring layers 51 on a bonding layer 63.

On the other hand, on the backside of the semiconductor substrate 53, an insulating layer 55 as an antireflective coating, a passivation layer 56, and a planarizing film 57 that serves as a base-adhesive layer for an on-chip color filter are stacked in this order. The insulating layer 55 used as the antireflective coating is constructed of, for example, two layers, a SiN layer and a SiO$_2$ layer, which are stacked in this order. For example, on-chip color filters 59 of red (R), green (G), and blue (B) are formed on the planarizing film 57 corresponding to pixels of the imaging region, that is, the respective photodiodes (PDs) 54. In addition, on-chip microlenses 58 are formed on the respective on-chip color filters 59.

The imaging region includes an effective pixel area, and an optical black area on the outside of the effective pixel area. The optical black area specifies the black level of a pixel. The optical black area includes the pixels and color filters as those in the effective pixel area. Although not illustrated, a light-shielding film is formed all over the surface including other pixel transistors, and the peripheral circuit section, except for each of light-sensing parts of the effective pixel area, that is, the photodiodes (PDs) 54 and the pad part 60. An opening 62 is formed in the pad part 60. The opening 62 is provided for exposing desired wiring of the plurality of wiring layers 51, the wiring 521a in this example.

FIGS. 2A and 2B illustrate an example method of forming the pad part 60. First, as shown in FIG. 2A, pixels each having a photodiode (PD) 54 and pixel transistors (not shown) are formed on a semiconductor substrate 53 and a plurality of wiring layers 51 is then formed on the front side of the semiconductor substrate 53, followed by bonding a supporting substrate 61 to the plurality of wiring layers 51 on a bonding layer 63. Furthermore, an insulating layer 55 as an antireflective coating, a passivation layer 56, and a planarizing film 57 that serves as a base-adhesive layer are stacked in this order on the backside of the semiconductor substrate 53. Subsequently, an opening 62 is formed by etching and removing the part, which corresponds to the pad part 60, of each of the planarizing film 57, the passivation layer 56, the insulating layer 55, the semiconductor substrate 53, and the insulating interlayer 50 up to the first wiring 521a of the plurality of wiring layers 51.

After that, as shown in FIG. 2B, an organic film that serves as an on-chip color filter member, such as a resist film, is formed and then patterned. As a result, on-chip color filters 59 of, for example, red (R), green (G), and blue (B) are formed. Furthermore, an organic film that serves as an on-chip microlens member 58A, such as a resist film, is formed and then subjected to a transfer method including an etch-back process to form on-chip microlenses 58.

SUMMARY OF THE INVENTION

In the manufacturing method as illustrated in FIGS. 2A and 2B, both the on-chip color filters 59 and the on-chip microlenses 58 are formed after the formation of the opening 62 of the pad part 60. In this case, however, the application of organic films provided as an on-chip color filter member and an on-chip microlens member, such as resist films, may cause striations, or uneven coatings. In other words, since the opening 62 is formed from the planarizing film 57 on the backside of the substrate to the wiring 521a through the semiconductor substrate 53, a stepped portion with a height of 3 μm or more, for example, approximately 6 μm, may be formed on the opening 62. Therefore, when applying a resist film by spin coating, a striation may occur from the stepped portion as the starting point. The striation leads to unevenness of the completed on-chip color filters 59 and on-chip microlens 58. As a result, variation in imaging characteristics of the solid-state imaging device may occur, leading to a decrease in reliability thereof.

The present invention has been made in consideration of the foregoing and it is desirable to provide a method of manufacturing a backside-illuminated solid-state imaging device that retains high reliability without causing any variation in imaging characteristics while having the opening of a pad part on the light-incident backside. It is also desirable to provide a method of manufacturing an electronic apparatus having such a solid-state imaging device.

According to embodiments of the present invention, there are provided a method of manufacturing a solid-state imaging device and a method of manufacturing an electronic apparatus, respectively. In each of these methods, a signal circuit is formed on an insulating interlayer on one side of a semiconductor substrate on which a photoelectric conversion part is formed, and light is incident on the photoelectric conversion part from the other side of the semiconductor substrate. Each of the methods includes the steps of forming an on-chip color filter and an on-chip microlens on the light-incident side, and subsequently forming an opening for a pad part on the light-incident side.

According to each of the methods, the opening is formed for the pad part after forming an on-chip color filter and an on-chip microlens. Thus, organic films to be the on-chip color filter and on-chip microlens can be formed to a base surface substantially without any stepped portion. Therefore, such a method can prevent the applied organic film from generating any striation due to a stepped portion.

The method of manufacturing a solid-state imaging device and the method of manufacturing an electronic apparatus according to the respective embodiments of the present invention can provide a backside-illuminated solid-state imaging device and an electronic apparatus with high reliability without any variation in imaging characteristics, because striations can be prevented from being generated in organic coating films.

BRIEF DESCRIPTION OF THE DRAWINGS

FIG. 2A and FIG. 2B illustrate different steps.

FIG. 6A and FIG. 6B illustrate different steps of the method.

FIG. 7C and FIG. 7B illustrate different subsequent steps of the method.

FIG. 8E and FIG. 8F illustrate different subsequent steps of the method.

FIG. 9G and FIG. 9H illustrate different subsequent steps of the method.

FIG. 10I and FIG. 10J illustrate different subsequent steps of the method.

FIG. 11K and FIG. 11L illustrate different subsequent steps of the method.

FIGS. 13A and FIG. 13B illustrate different steps of the method.

FIG. 14C and FIG. 14D illustrate different subsequent steps of the method.

FIG. 15E and FIG. 15F illustrate different subsequent steps of the method.

DESCRIPTION OF THE PREFERRED EMBODIMENTS

Hereafter, embodiments of the present invention will be described in detail with reference to the attached drawings.

Figure 1:
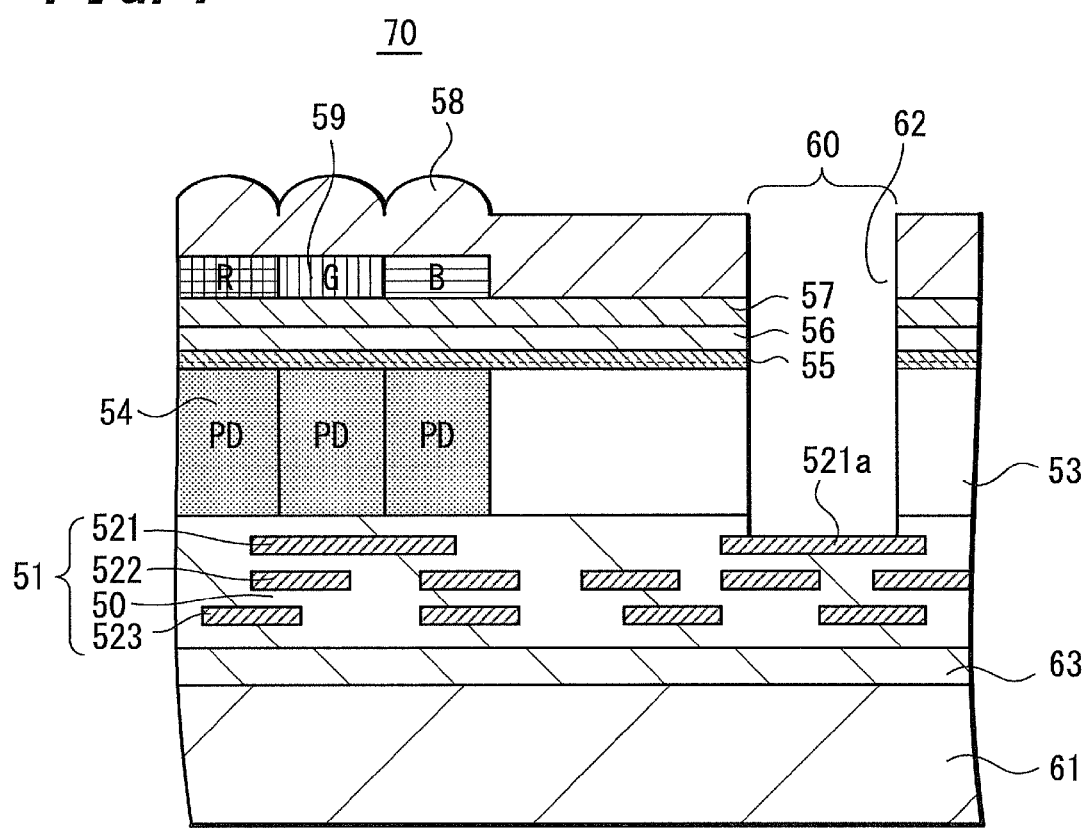
FIG. 1 is a cross-sectional view of the main part of a backside-illuminated solid-state imaging device.
Figure 2A:
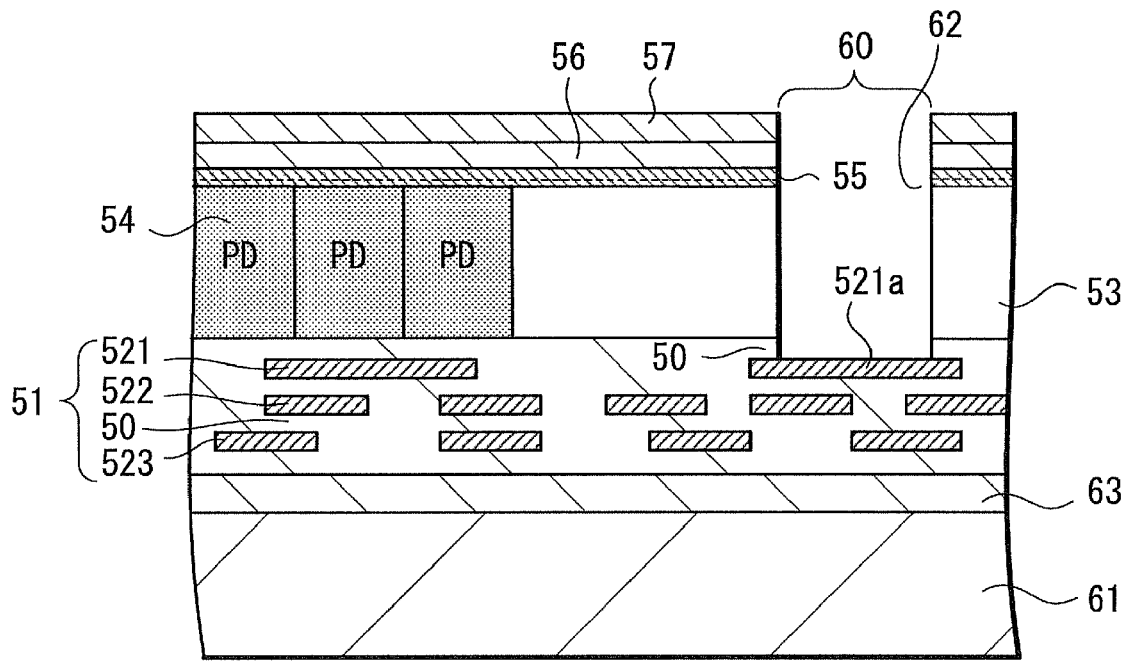
FIGS. 2A and 2B are schematic diagrams illustrating an example of a method of manufacturing a backside-illuminated solid-state imaging device of the related art, where
Figure 2B:
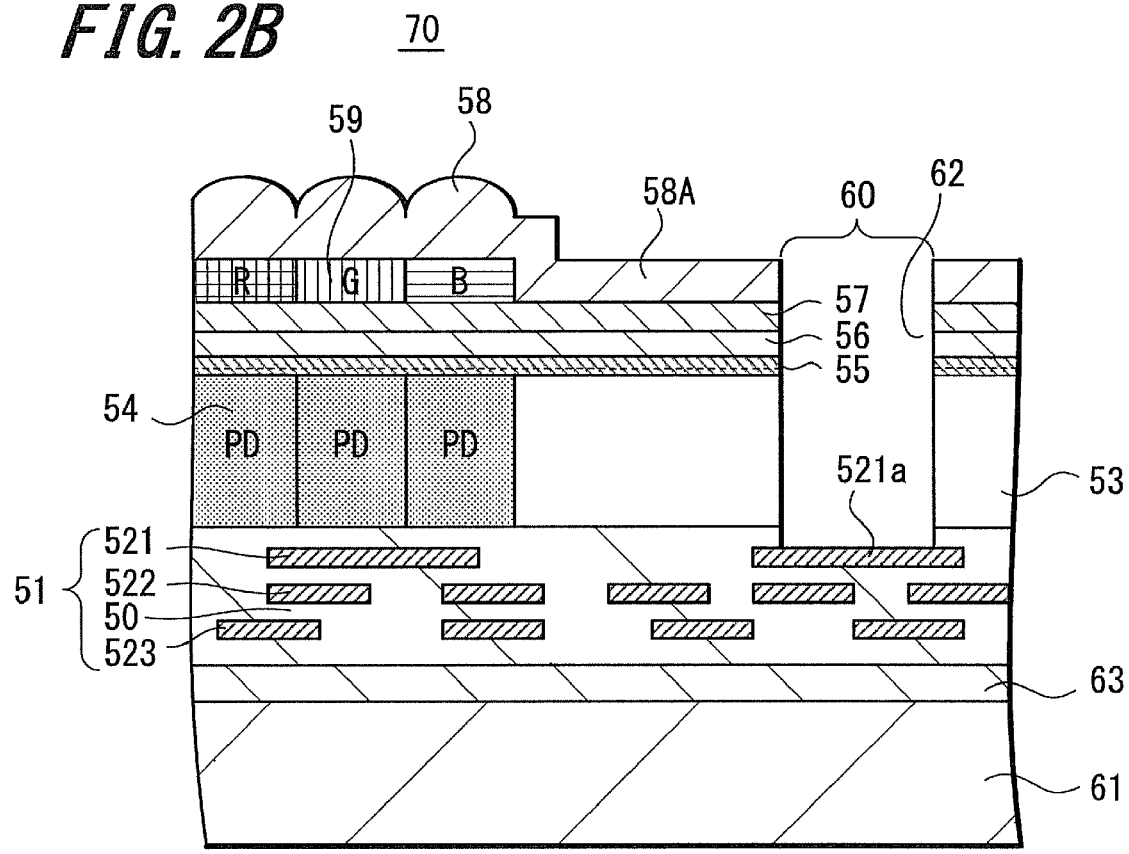
Figure 3:
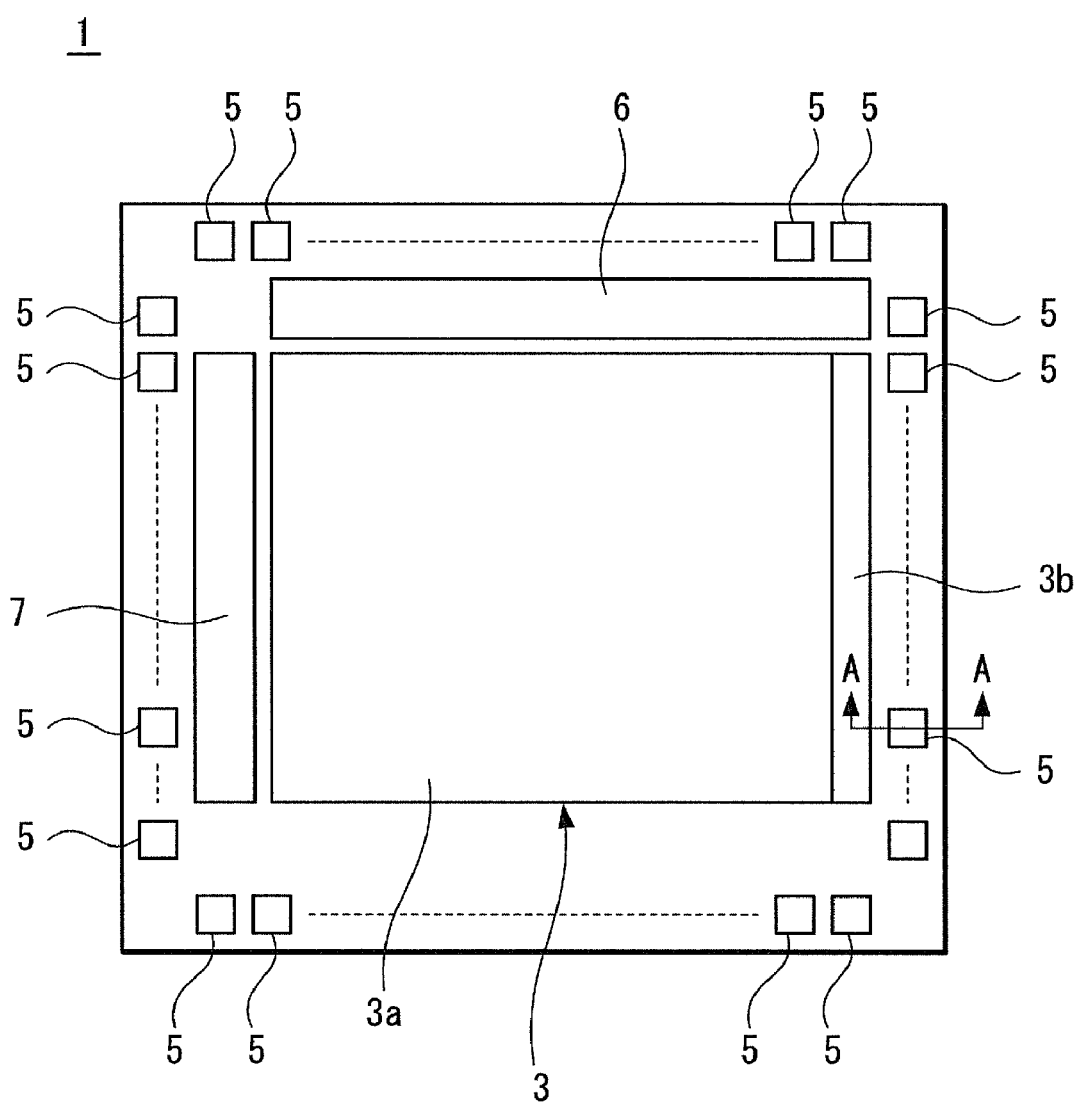
FIG. 3 is a schematic diagram illustrating the configuration of a backside-illuminated CMOS solid-state imaging device.
Figure 4:
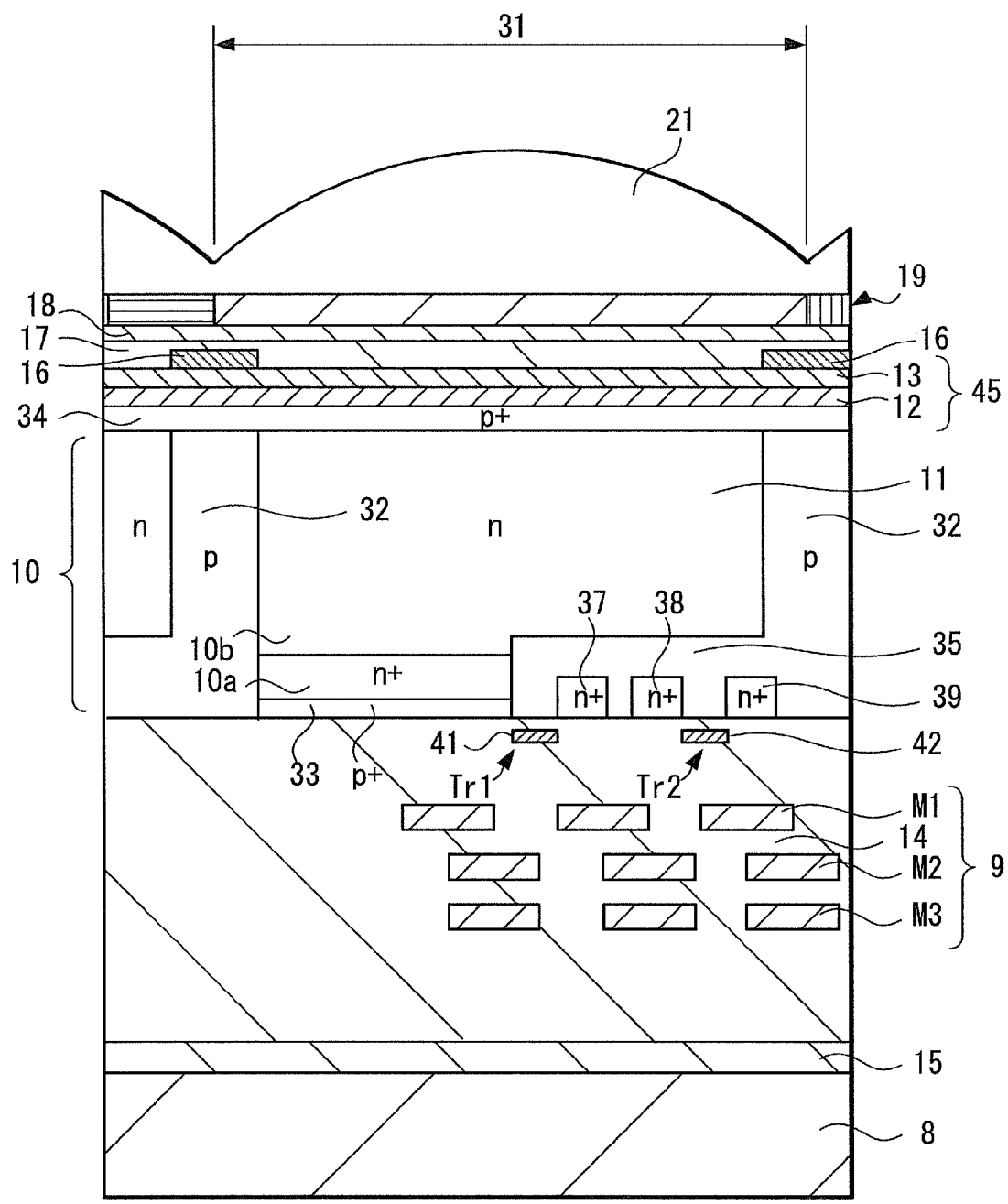
FIG. 4 is a cross-sectional view of a unit pixel.
Figure 5:
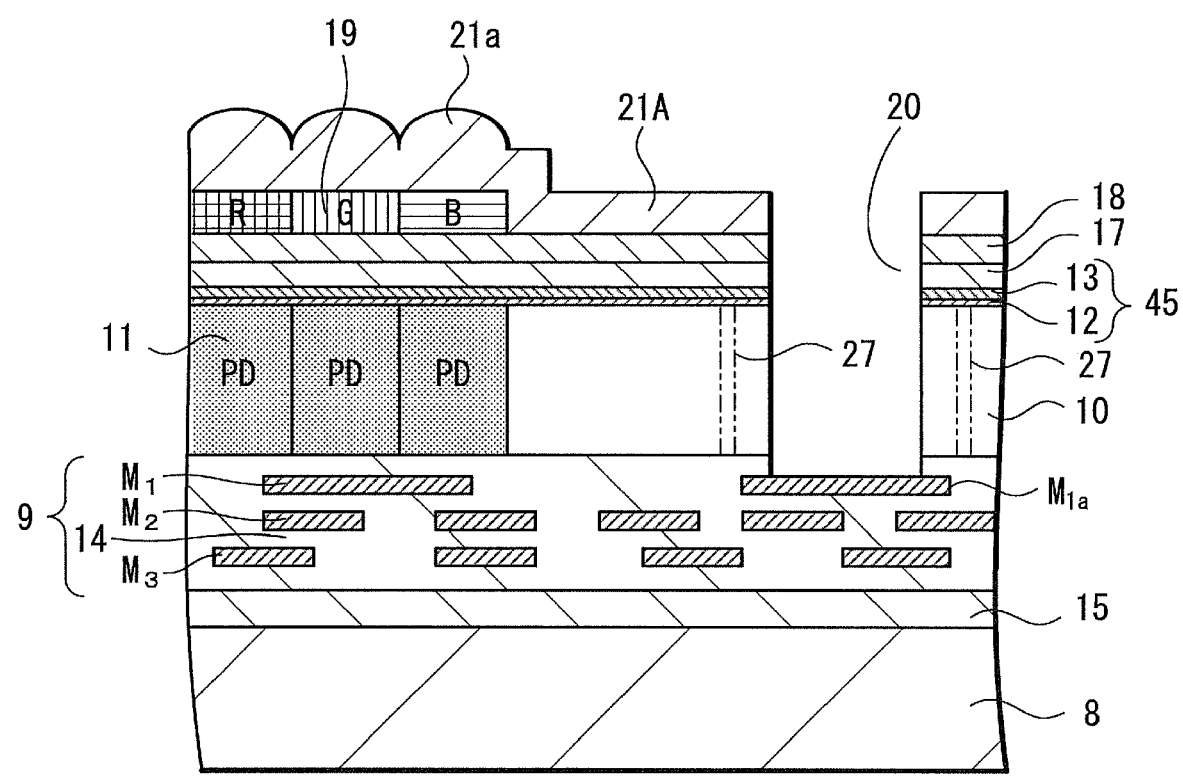
FIG. 5 is a cross-sectional view of a pad part along the line A-A of FIG. 3.

FIGS. 3 to 5 illustrate the schematic configuration of a solid-state imaging device according to an embodiment of the present invention. Such a configuration can also be applied to an electronic apparatus according to another embodiment of the present invention. In the embodiments of the present invention, the solid-state imaging device and the electronic apparatus are those of a backside-illuminated type. As shown in FIG. 3, a solid-state imaging device 1 of the present embodiment includes an imaging region 3, peripheral circuits 6 and 7, and a plurality of pad parts 5 on the periphery thereof.

In the imaging region 3, a plurality of unit pixels is arranged in matrix. In addition, address lines and so on are formed every line, while signal lines and so on are formed every column. The imaging region 3 includes an effective pixel area 3a and an optical black area 3b that specifies the black level of a pixel. The optical black area 3b also includes the same kind of pixels as those of the effective pixel area 3a. The pixels that constitute the optical black area 3b are arranged on the outside of the effective pixel area 3a. The whole surface of the solid-state imaging device 1 except for the photoelectric conversion parts (light-sensing parts) of the respective pixels in the effective pixel area 3a and the pad parts 5 is covered with a light-shielding film.

In the imaging region 3, each pixel includes a photoelectric conversion part, such as a photodiode (PD), and a plurality of pixel transistors (or MOS transistors). The plurality of pixel transistors may include, for example, four transistors: a transfer transistor, a reset transistor, an amplification transistor, and a selection transistor. Alternatively, it may include three transistors: a transfer transistor, a reset transistor, and an amplification transistor. The plurality of pixel transistors may be provided in different configurations.

FIG. 4 illustrates an example of cross-sectional structure of a unit pixel. In this example, a unit pixel 31 is formed as follows. First, a second conductivity type p-type pixel isolating region 32 is formed in a silicon semiconductor layer 10 that corresponds to a first conductivity type n-type semiconductor substrate. Then, the unit pixel 31 is completed by forming a photodiode (PD) 11 provided as a photoelectric conversion part and a plurality of pixel transistors Tr1 and Tr2 in each pixel region. The photodiode 11 includes an n-type semiconductor layer 10 and a $p^+$-accumulation layers 33 and 34. The n-type semiconductor layer 10 is surrounded by a p-type pixel isolating region 32 and a comparatively deep p-type semiconductor well region 35 in which the plurality of pixel transistors Tr1 and Tr2 are formed. The $p^+$-accumulation layers 33 and 34 are provided to suppress the generation of dark current on both front and back sides. The n-type semiconductor layer 10 forming the photodiode 11 includes a highly-doped $n^+$-charge accumulation region 10a, which is located on the front side of the semiconductor layer 10, and a lightly-doped n-type region 10b, which is made of the semiconductor layer 10. The n-type region 10b extending to the backside of the semiconductor layer 10 is formed such that it extends below the p-type semiconductor well region 35, where the pixel transistors Tr1 and Tr2 are formed.

The plurality of pixel transistors Tr1 and Tr2 may include, for example, four transistors as described above. In FIG. 4, Tr1 represents the transfer transistor and Tr2 represents any of the reset transistor, the amplification transistor, and the selection transistor. The pixel transistor Tr1 includes an $n^+$-source/drain region 37 to be functioned as a floating diffusion (FD) portion, an $n^+$-charge accumulation region 10a of the photodiode 11, and a gate electrode 41 formed on a gate insulating layer. The pixel transistor Tr2 includes a pair of source/drain regions 38 and 39 and a gate electrode 42 on the gate insulating layer.

A plurality of wiring layers 9 that forms wiring layers M1 to M3 is provided on the insulating interlayer 14 on the front side of semiconductor layer 10. Furthermore, a supporting substrate 8, such as a silicon substrate, is bonded to the plurality of wiring layers 9 on a bonding layer 15. The first to third wiring layers M1 to M3 constitute a desired signal circuit and provided as Cu or Au wiring by a damascene process or the like. As described later, wiring at least facing the pad part for connecting to an Au wire at the time of wire bonding, corresponding to the first wiring layer M1, is made of Al wiring. Preferably, in light of the process, the entire first wiring layer M1 is made of Al.

An insulating layer provided as an antireflective coating 45 is formed on the back side of the semiconductor layer 10. The antireflective coating 45 includes, for example, a silicon nitride (SiN) layer 12 and a silicon oxide ($SiO_2$) layer 13 which are stacked in this order. A light-shielding layer 16 is formed on the entire antireflective coating 45 except a portion corresponding to the light-sensing part of the photodiode 11. Furthermore, a passivation layer 17 and a planarizing film 18 which serves as a base-adhesive layer for an on-chip color filter are formed in this order. The passivation layer 17 may be designed to serve as the above planarizing film. The light-shielding layer 16 is formed of a metal film. On-chip color filters 19 of, for example, the respective primary colors, red (R), green (G), and blue (B), are formed on the planarizing film 18 and on-chip microlenses 21 are then formed on the respective filters 19.

On the other hand, but not shown in the figure, each of the peripheral circuits 6, 7 includes a vertical drive circuit, a column signal processing circuit, a horizontal drive circuit, an output circuit, a control circuit, and so on. The control circuit generates signals on the basis of a vertical synchronize signal, a horizontal synchronize signal and master clock. The generated signals include a clock signal and a control signal to be referenced when operating the vertical drive circuit, the column signal processing circuit, and the horizontal drive circuit. These signals are input from the control circuit to the vertical drive circuit, the column signal processing circuit, and the horizontal drive circuit, respectively. The vertical drive circuit, which is constructed of a shift register or the like, sequentially performs selective scanning of the pixels in the imaging region one line at a time. Then, the vertical drive circuit supplies a pixel signal to the column signal processing circuit through a vertical signal line. The pixel signal is based on a signal electric charge generated according to the amount of light received by the photoelectric conversion part of each pixel. The column signal processing circuit is provided, for example, every column of the pixels and carries out signal processing, such as noise removal and signal amplification, of a signal output from the pixels on one line with reference to a signal from a black reference pixel in the optical black area. In the output stage of the column signal processing circuit is connected a horizontal selection switch which is located between the column signal processing circuit and a horizontal signal line. The horizontal drive circuit, which is constructed of a shift resister or the like, sequentially outputs horizontal scanning pulses, selecting the respective column signal processing circuits in order to output pixel signals thereof to the horizontal signal line. The output circuit carries out signal processing on signals sequentially supplied from the respective column signal processing circuits through the horizontal signal line and then outputs the processed signals.

As shown in FIG. 5 (cross-sectional view along the line A-A in FIG. 3), an opening 20 is formed in the pad part 5 on the periphery of the backside, where a primary on-chip microlens 21a (described later) is formed, and reaches the Al wiring from the surface of an on-chip microlens member 21A. Both the front and back sides of the Al wiring is covered with, for example, a TiN layer, a TiN/Ti layer, a TiN/Ti/TiN layer, or a Ti/TiN/Ti layer. As for the opening 20, an insulating isolation layer 27 or the like may be formed in the semiconductor layer 10 so that it can surround the opening 20 or the like to avoid a disadvantage of causing the Au wire to be electrically short circuited to the semiconductor layer 10 at the time of wire bonding with an Au wire.

Referring now to FIGS. 6 to 11, a first example method of manufacturing a solid-state imaging device according to an embodiment of the present invention will be described. Any of these figures illustrates a cross-sectional view along the line A-A in FIG. 3.

Figure 6A:
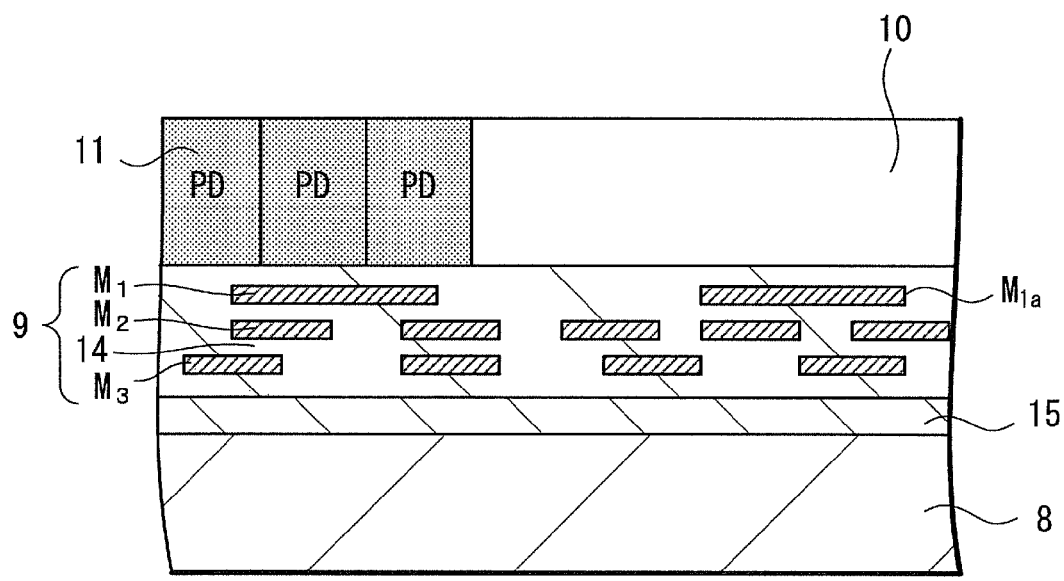
FIGS. 6A and 6B are schematic diagrams (Part I) illustrating a first example method of manufacturing a solid-state imaging device according to an embodiment of the present invention, where

First, a structure is formed as shown in FIG. 6A. The structure includes a semiconductor layer corresponding to a semiconductor substrate, such as a silicon semiconductor layer 10, a plurality of wiring layers 9 formed on the front side of the silicon semiconductor layer 10, and a supporting substrate 8 joined to the front side of the plurality of wiring layers 9 on a bonding layer 15. In the imaging region of the silicon semiconductor layer 10, a plurality of pixels is arranged in a matrix in a plane. The pixel includes a photodiode (PD) 11 used as a photoelectric conversion part and a plurality of pixel transistors.

In a method of forming such a structure, for example, a plurality of pixels is formed on one side of a silicon semiconductor substrate and a plurality of wiring layers 9 is then formed on the same side thereof. Subsequently, a supporting substrate 8 of a silicon substrate or the like, is bonded to the same side on a bonding layer 15. Subsequently, the silicon semiconductor substrate 10 is removed from the other side thereof to have a certain thickness of the silicon semiconductor layer 10.

In the plurality of wiring layers 9, wirings M1-M3 of two or more layers including signal circuits and other wirings are formed on an insulating interlayer 14. The insulating interlayer 14 may be a silicon oxide ($SiO_2$) layer or the like. The plurality of wiring layers 9 as shown in FIG. 6A is an example configuration of wiring of three layers in total, a first layer of wiring M1, a second layer of wiring M2, and a third layer of wiring M3. The wiring M1, M2, and M3 can be made of Cu, Al, or the like. Wiring M1a of the wiring M1 is formed of, for example, Al wiring comparable with an Au wire, which can be bonded to the Au wire at the pad part for taking out an electrode as described layer. Both the front and back sides of the Al wiring are covered with barrier metal layers, but not shown in the figure, as described above.

Figure 6B:
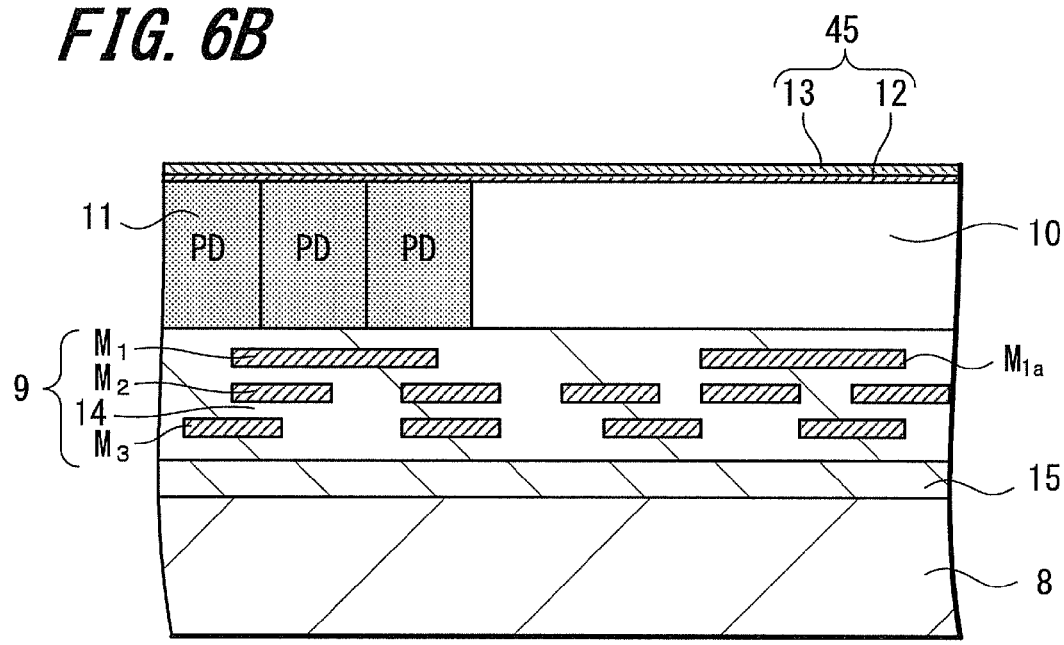

Next, as shown in FIG. 6B, an insulating layer serving as an antireflective coating 45 is formed on the back side of the silicon semiconductor layer 10. This antireflective coating 45 is constructed of a silicon nitride (SiN) layer 12 and a silicon oxidization ($SiO_2$) layer 13 stacked in this order from the silicon semiconductor layer 10.

Figure 7C:
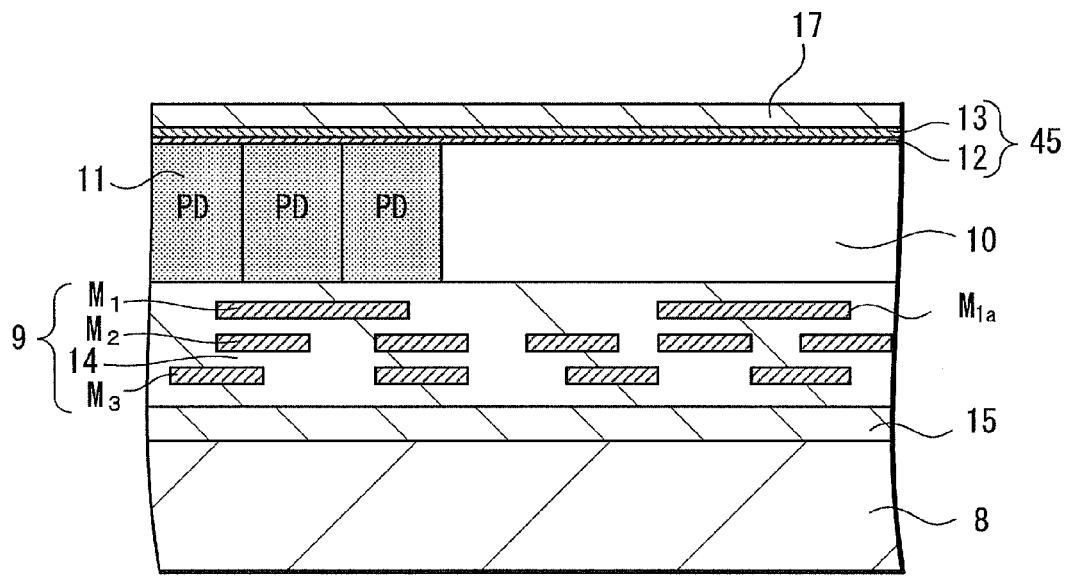
FIGS. 7C and 7D are schematic diagrams (Part II) illustrating the first example method of manufacturing a solid-state imaging device according to an embodiment of the present invention, where
Figure 7D:
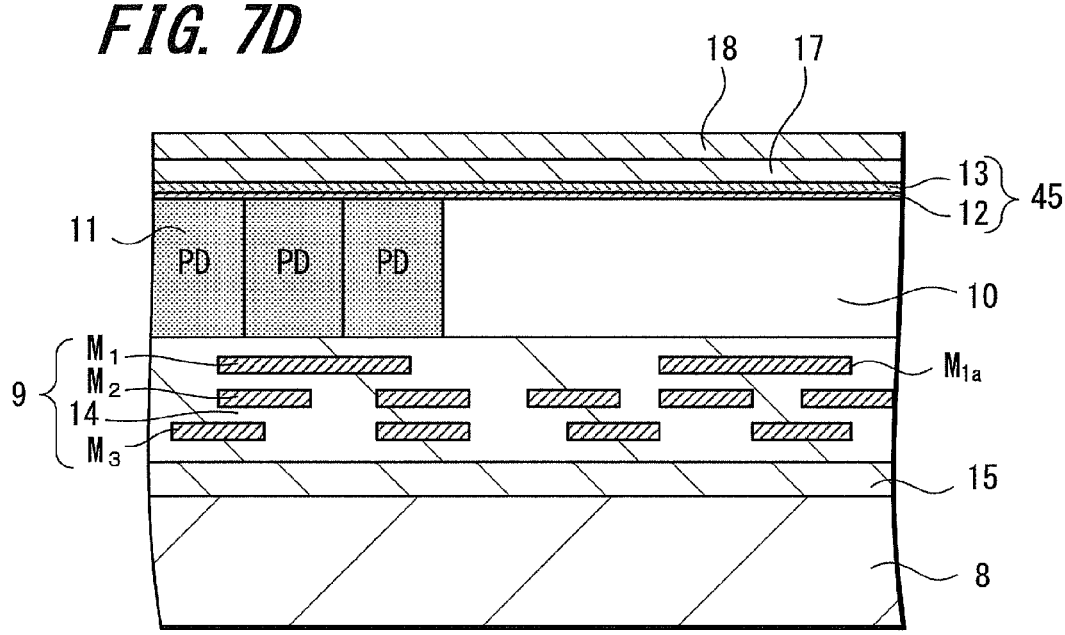

Next, as shown in FIG. 7C, a passivation layer 17 is formed on the antireflective coating 45, and as shown in FIG. 7D, a planarizing film 18 which serves as a base-adhesive layer for improving adhesion with an on-chip color filter is further formed on the passivation layer 17.

Figure 8E:
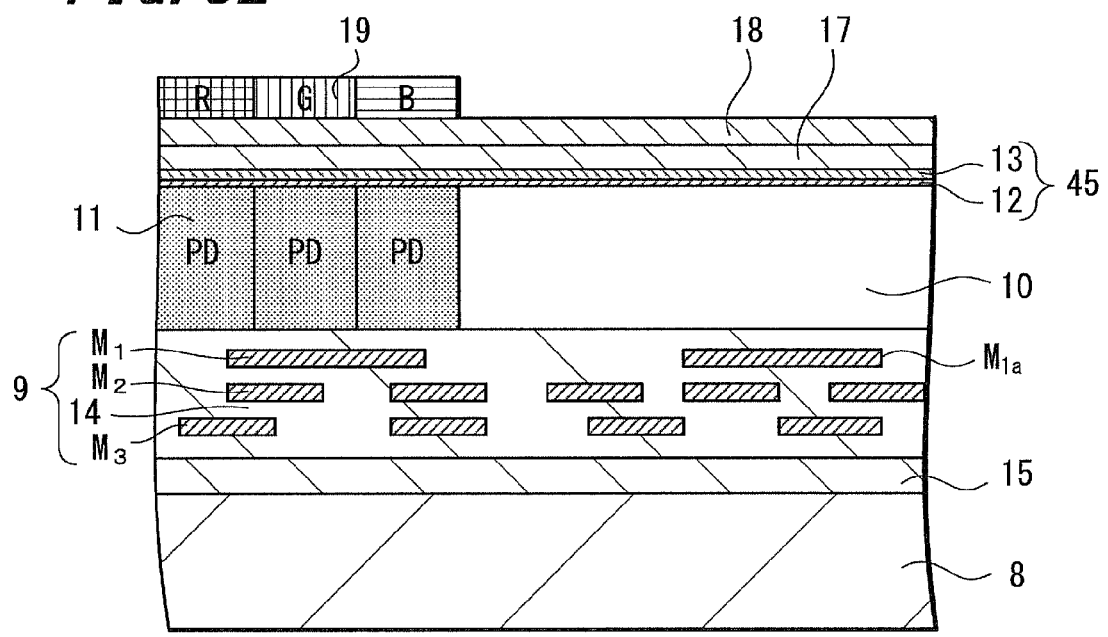
FIGS. 8E and 8F are schematic diagrams (Part III) illustrating the first example method of manufacturing a solid-state imaging device according to an embodiment of the present invention, where

Next, as shown in FIG. 8E, a color filter 19 is formed on the planarizing film 18. The on-chip color filter 19 of this example is constructed of, for example, filters of primary colors, red (R), green (G), and blue (B). The on-chip color filter 19 can be formed as follows. An organic film such as a resist film for color filter of first color is applied to the smooth planarizing film 18 by a coater developer and then subjected to patterning, thereby forming a first color filter. Next, a resist film for color filter of second color is applied and then subjected to patterning, thereby forming a second color filter. Subsequently, a third color filter is formed similarly. Since the resist films for the respective color filters are formed on the planarizing film 18 without a stepped portion, the applied resist films are free of striation.

Figure 8F:
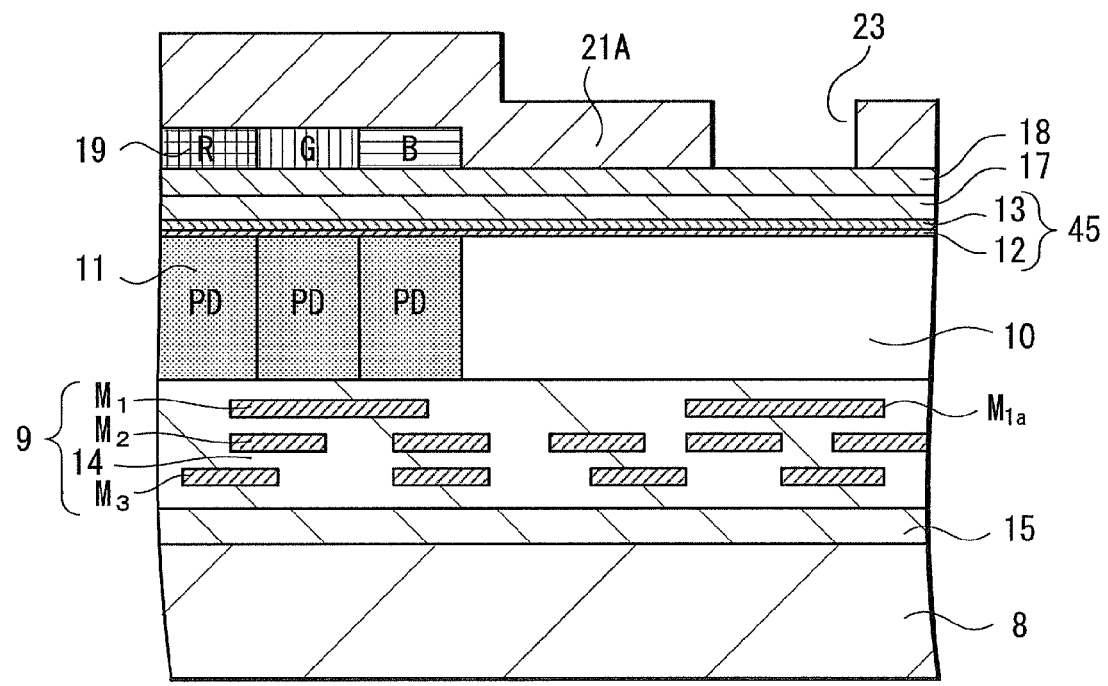

Next, as shown in FIG. 8F, an on-chip microlens member 21A is applied and formed on the whole area including the surface of the on-chip color filter 19 by a coater developer. The on-chip microlens member 21A may be an organic film, such as a negative resist film. After applying the on-chip microlens member 21A, lithographic and etching technologies are used for forming an opening 23 by selectively removing part of the on-chip microlens member 21A where a pad part will be formed. The on-chip microlens member 21A made of such a resist film is applied to a base surface before forming a large stepped portion, such as the opening of the pad part, that is, substantially without any stepped portion having been made. Thus, the applied on-chip microlens member 21A does not cause any striation.

Figure 9G:
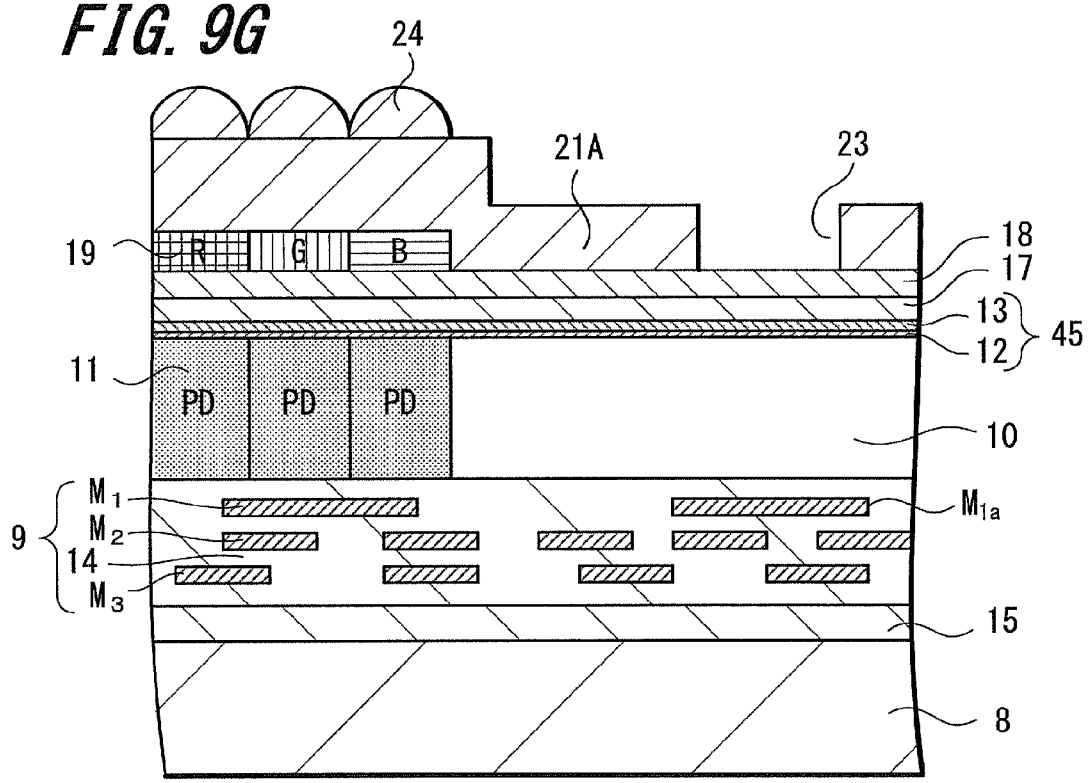
FIGS. 9G and 9H are schematic diagrams (Part IV) illustrating the first example method of manufacturing a solid-state imaging device according to an embodiment of the present invention, where

Next, as shown in FIG. 9G, a lens-shaped member 24 with a desired curvature, which corresponds to an on-chip lens for each of the pixels, is formed on the on-chip microlens member 21A, that is, at a position above the on-chip color filter 19. The lens-shaped member 24 is formed using a positive resist film. That is, the positive resist film is applied and then subjected to patterning for each of the pixels, followed by a reflow process.

Figure 9H:
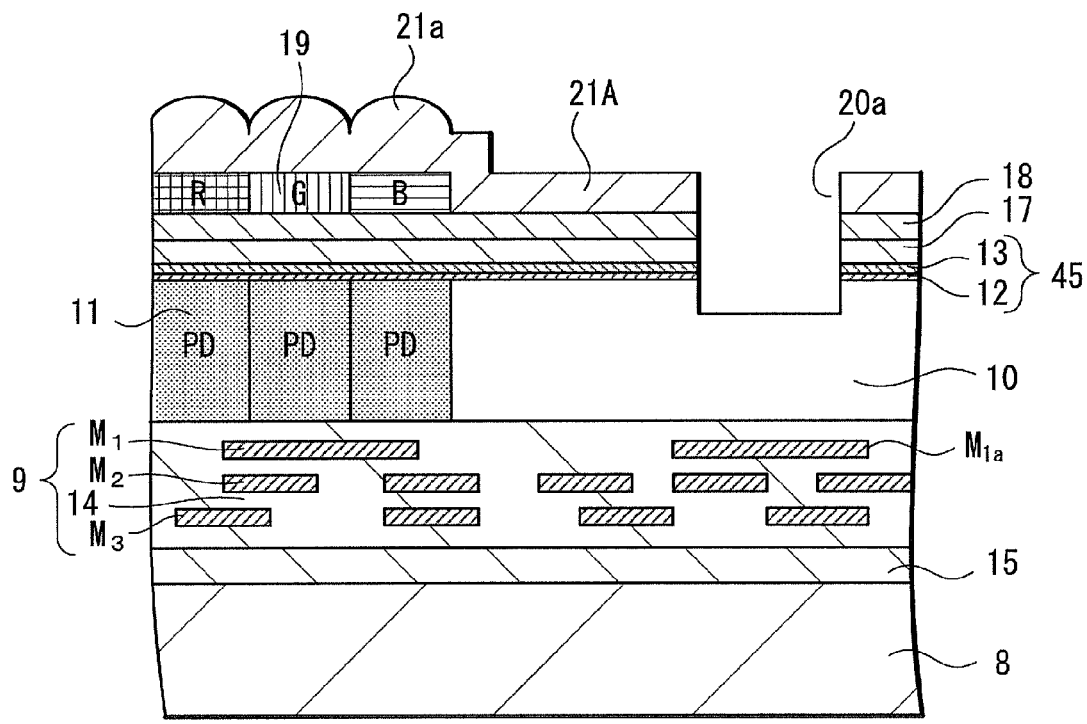

Next, as shown in FIG. 9H, the whole-surface is etch-back. In this process, the lens shape of the lens-shaped member 24 is transferred to the on-chip microlens member 21A. The transfer process makes a primary on-chip microlens 21a but not the final on-chip microlens 21. Simultaneously, in this process, a primary opening 20a is formed by etching and removing the portions of the planarizing film 18, passivation layer 17, and antireflective coating 45 and partially the silicon semiconductor layer 10 through the opening 23 of the on-chip microlens member 21A. Through the etch-back process, the surface of the transferred primary on-chip microlens 21a and the surface of the other portion of the on-chip microlens member 21A are hardened.

Figure 10I:
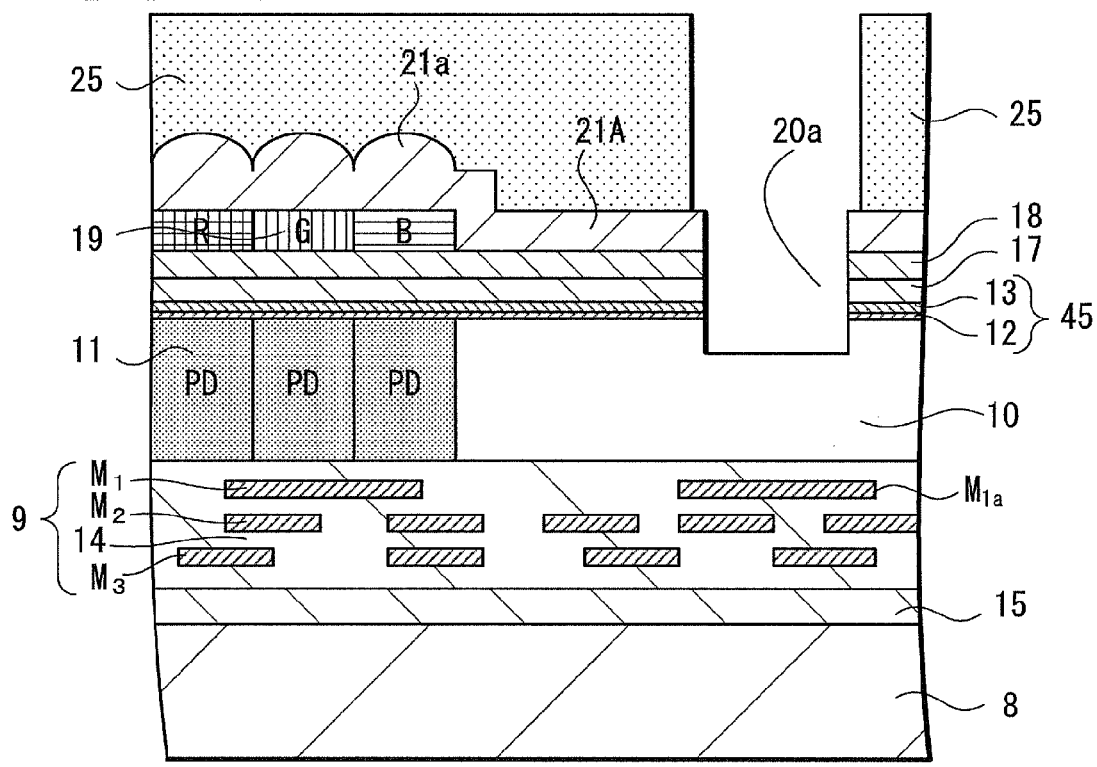
FIGS. 10I and 10J are schematic diagrams (Part V) illustrating the first example method of manufacturing a solid-state imaging device according to an embodiment of the present invention, where

Next, as shown in FIG. 10I, a resist mask 25 is formed on both the on-chip microlens member 21A and the primary on-chip microlens 21a, except the opening 23.

Figure 10J:
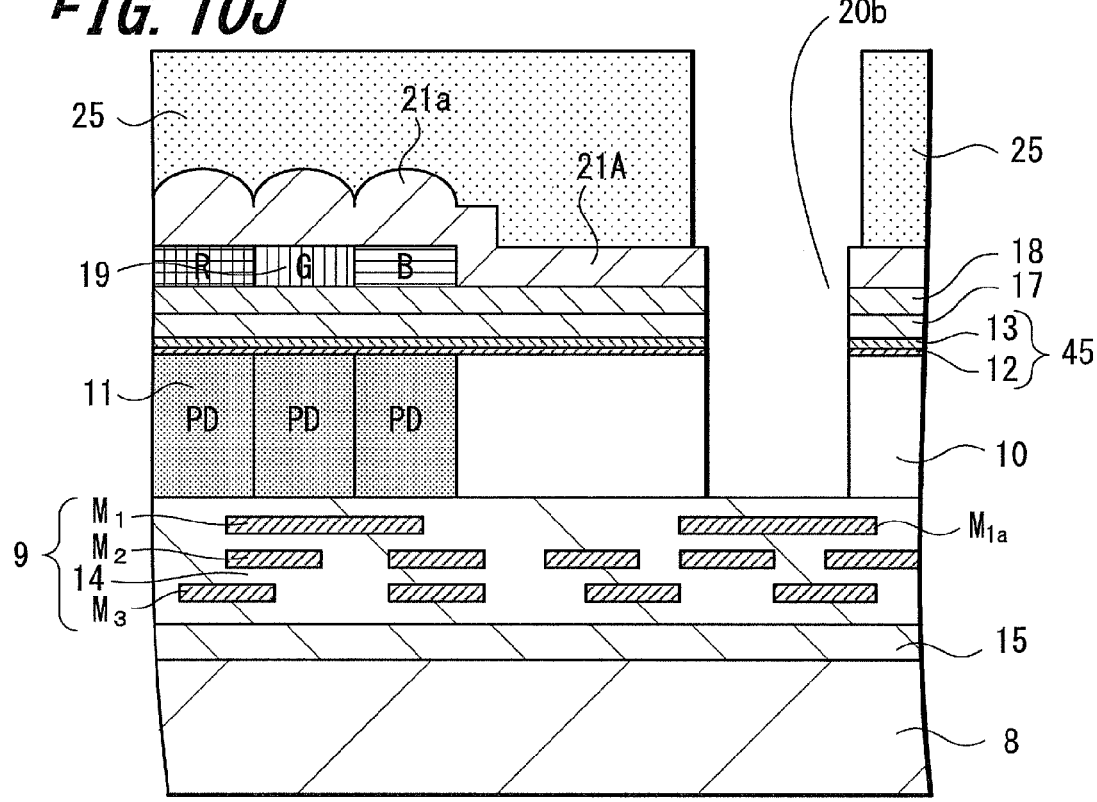

Next, as shown in FIG. 10J, a dry-etching process is carried out through the resist mask 25 to entirely remove the silicon semiconductor layer 10 from the bottom of the primary opening 20a, thereby forming a secondary opening 20b. In other words, the silicon semiconductor layer 10 is entirely removed from a portion extending from the plurality of wiring layers 9 to the insulating interlayer 14. The resist mask 25 used in this example may be any of those typically used in the known semiconductor process.

Figure 11K:
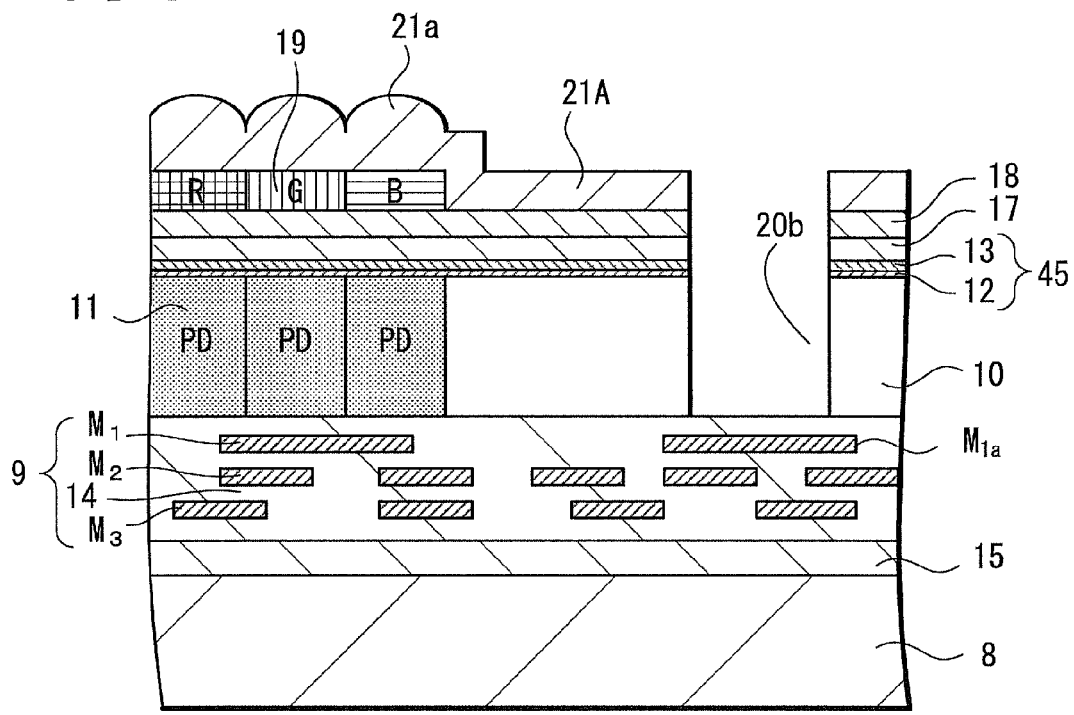
FIGS. 11K and 11L are schematic diagrams (Part VI) illustrating the first example method of manufacturing a solid-state imaging device according to an embodiment of the present invention, where

Next, as shown in FIG. 11K, the resist mask 25 is stripped and removed. The resist material of the on-chip microlens member 21A is different from that of the resist mask 25. In addition, both the surface of the on-chip microlens member 21A and the surface of the primary on-chip microlens 21a have been hardened as a result of the above etch-back process. Thus, the resist mask 25 can be readily stripped.

In addition, since dry etching is carried out in an etching step in FIG. 10J on the silicon semiconductor using a gas mixture of $SF_6$ and $O_2$, the generation of undesired reaction product can be prevented. Accordingly, the generation of undesired reaction product can be suppressed as much as possible. Adhesion of undesired reaction product to the surface of the resist mask 25 can be decreased extremely. Therefore, only the resist mask 25 can readily be stripped and removed using an organic solvent, such as thinner, or by ashing in combination with such an organic solvent, without causing any abnormality in the primary on-chip microlens 21a.

Figure 12:
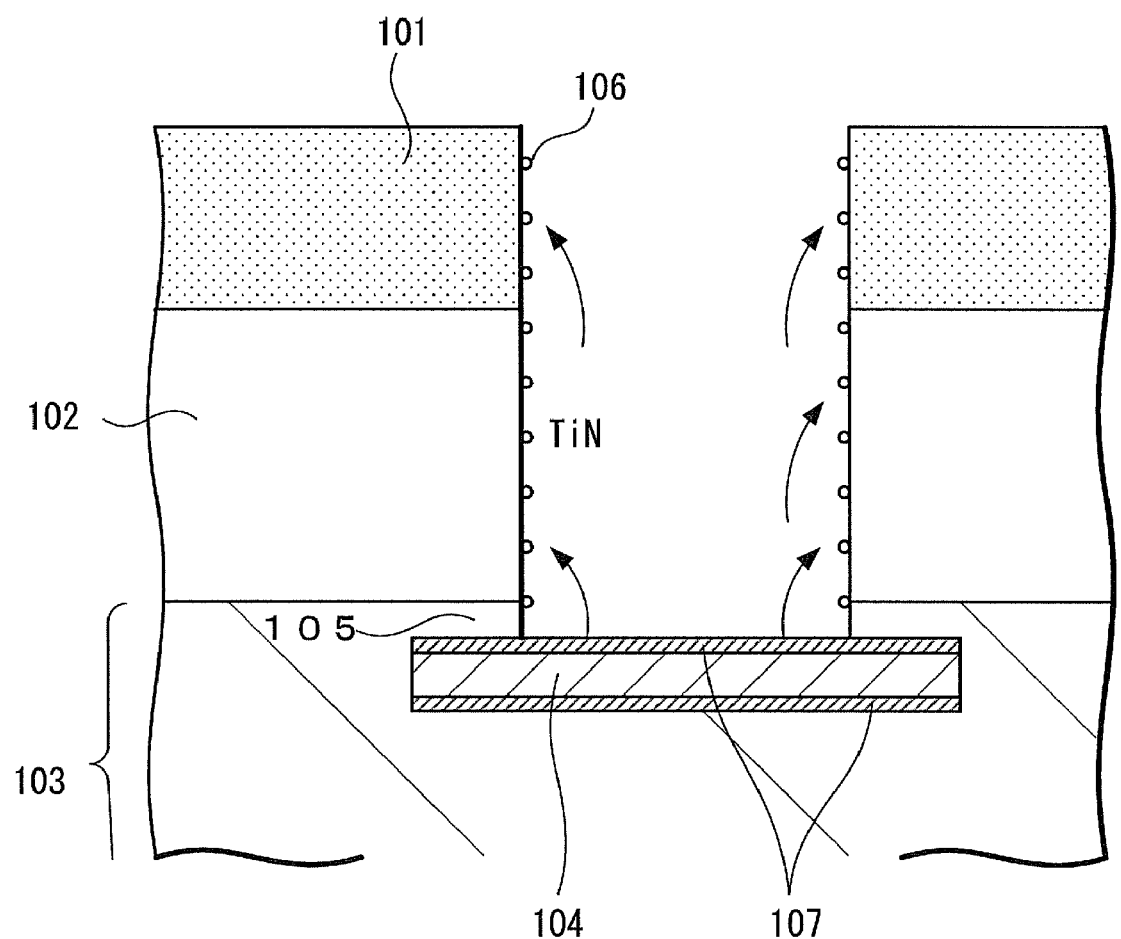
FIG. 12 is an explanatory diagram used for describing an embodiment of the present invention.

For comparison, FIG. 12 illustrates an example in which etching is carried out through a resist mask 101 up to an insulating interlayer 105 located between a silicon semiconductor 102 and Al wiring 104 of a plurality of wiring layers 103A for wire bonding. In this case, since the etching is carried out to expose the Al wiring 104, a large amount of an undesired reaction product 106 can be adhered to the surface of the resist mask 101. The undesired reaction product 106 may be mainly one generated as a result of etching a barrier metal layer (e.g., a TiN layer as described above) 107 on the surface of the Al wiring 104. If a large amount of the undesired reaction product 106 is adhered, it becomes difficult to strip the resist mask 101 with thinner, by ashing, or the like.

In the step shown in FIG. 10J according to the first example, etching is carried out only on the silicon semiconductor 10 with a gas mixture of $SF_6$ and $O_2$, while it is not carried out to expose Al wiring M1a. Thus, a resist mask 25 can be readily stripped off after the etching.

Figure 11L:
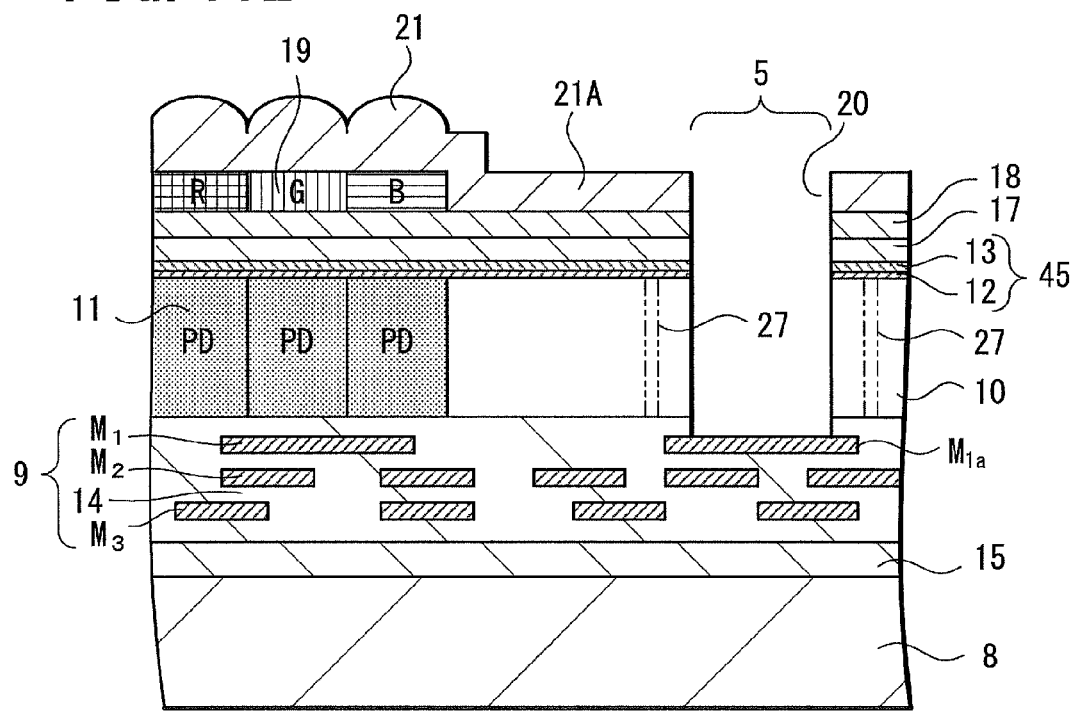

Next, as shown in FIG. 11L, the final on-chip microlens 21 is formed by carrying out a second whole-surface etch-back process under the same conditions as those of the first one for the formation of the primary on-chip microlens 21a. In this process, simultaneously, the insulating interlayer 14 located between the silicon semiconductor 10 and the Al wiring M1a for wire bonding is removed by etching, forming a final opening 20 from which the Al wiring can be exposed. A desired pad part 5 can be formed as a result of the formation of such an opening 20.

In addition, an insulating isolation layer 27 is formed in advance in part of the silicon semiconductor layer 10, which corresponds to the circumference of the opening 20. Therefore, when a bonding wire, such as an Au wire, is bonded in the opening 20, the bonding wire can be prevented from being electrically short-circuited to the other part of the silicon semiconductor layer 10.

According to the first example, both the method of manufacturing the solid-state imaging device and the method of manufacturing the electronic apparatus using such a device can include the step of applying organic films such as resist films for forming on-chip color filters and on-chip microlenses to the surface of the substrate (or base surface) substantially without any stepped portion before the formation of the opening 20 in the pad part 5. In the course of such a resist application work, since the base surface may not have any stepped portion, the resist film can be prevented from generating any striation due to the presence of a stepped portion around the opening of the pad part. By preventing the striation, both the on-chip color filter 19 and the on-chip microlens 21 can be formed uniformly. Thus, a solid-state imaging device with high reliability without inconsistent imaging characteristics and an electronic apparatus having such a device can be manufactured.

With the etch-back process to transfer the primary on-chip microlens 21a, the primary opening 20a is formed by simultaneously etching the planarizing film 18, the passivation layer 17, the antireflective coating 45 and partially etching the silicon semiconductor layer 10. Thus, the etching step for the formation of the final opening 20 is simplified. For comparison, if an opening 23 is not formed in an on-chip microlens member 21A and an opening 20b is formed in a pad part later at once, an etching process using a typical dry etching technique can be complicated. This is because of separately carrying out etching of the on-chip microlens member 21A, etching of the planarizing film 18, passivation layer 17, and antireflective coating 45, and etching of the silicon semiconductor layer 10 while selecting appropriate etching gases for the respective etching steps.

According to the present example, after carrying out the first whole-surface etch-back process, only the silicon semiconductor layer 10 is selectively etched and removed to form a secondary opening 20b. The silicon semiconductor layer 10 is dry-etched using a gas mixture of $SF_6$ and $O_2$. Therefore, the generation of an undesired reaction product can be prevented. Thus, an efficiency of subsequent removal of the resist mask 25 can be improved. Furthermore, both the surface of the primary on-chip microlens 21a and the surface of the on-chip microlens member 21A are hardened by the etch-back process, so that only the resist mask 25 can be readily stripped off in the step of removing the resist mask. In the step of removing the resist mask 25, an organic solvent such as thinner or a combination of an ashing process and an organic solvent such as thinner is used, so that the resist mask 25 can be removed without causing abnormalities to the on-chip microlens 21a.

In addition, with the second whole-surface etch-back process, the final on-chip microlens 21 is formed while removing the thin insulating interlayer 14 between the Al wiring M1a, the first layer of the signal circuit, and the silicon semiconductor layer 10, exposing the Al wiring M1a to be provided as an electrode lead-out part. Since the Al wiring M1a as an electrode leading-out part is exposed, the etching amount of the Al wiring M1a can be reduced.

Referring now to FIG. 13 to FIG. 16, a second example method of manufacturing a solid-state imaging device and method of manufacturing an electronic apparatus using such a device according to an embodiment of the present invention will be described. Each of these figures corresponds to the cross-sectional view along the line A-A in FIG. 3.

Figure 13A:
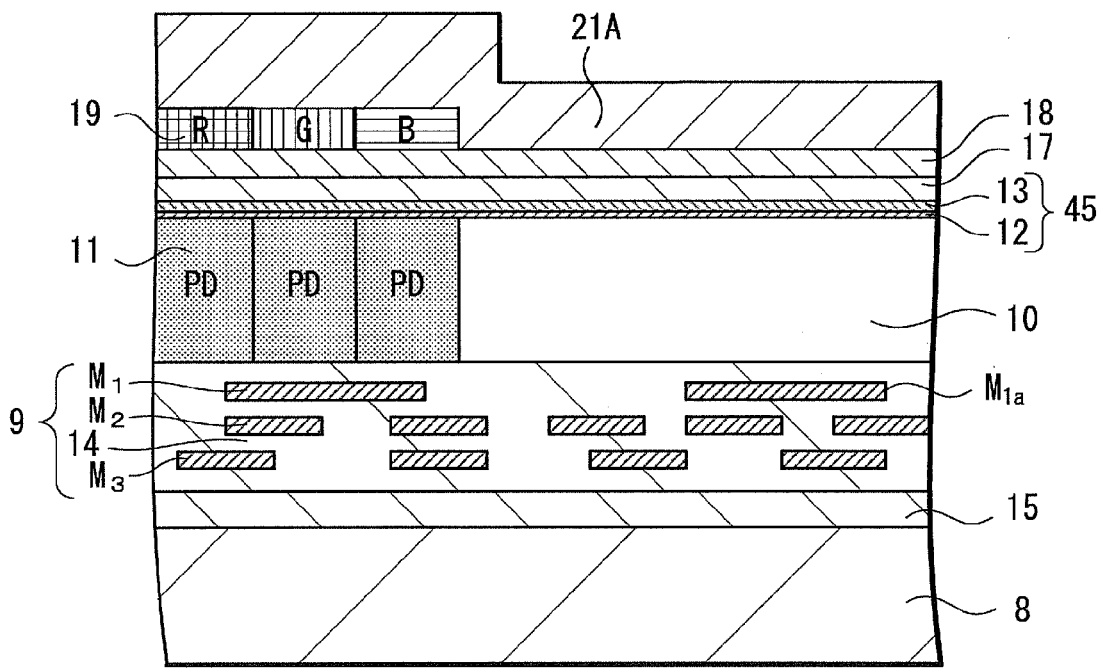
FIGS. 13A and 13B are schematic diagrams (Part I) illustrating a second example method of manufacturing a solid-state imaging device according to an embodiment of the present invention, where

The step shown in FIG. 13A follows the same preceding steps as those of FIG. 6A to FIG. 8 as described above. In the present example, as shown in FIG. 13A, after forming an on-chip color filter 19, an organic film that serves as an on-chip microlens member 21A, such as a negative resist film, is applied to the whole surface including the surface of the on-chip color filter 19 by a coater developer. Since this on-chip microlens member 21A is applied to the base surface substantially without any stepped portion just as in the case with the first example, any striation may not be generated in the applied on-chip microlens member 21A.

Figure 13B:
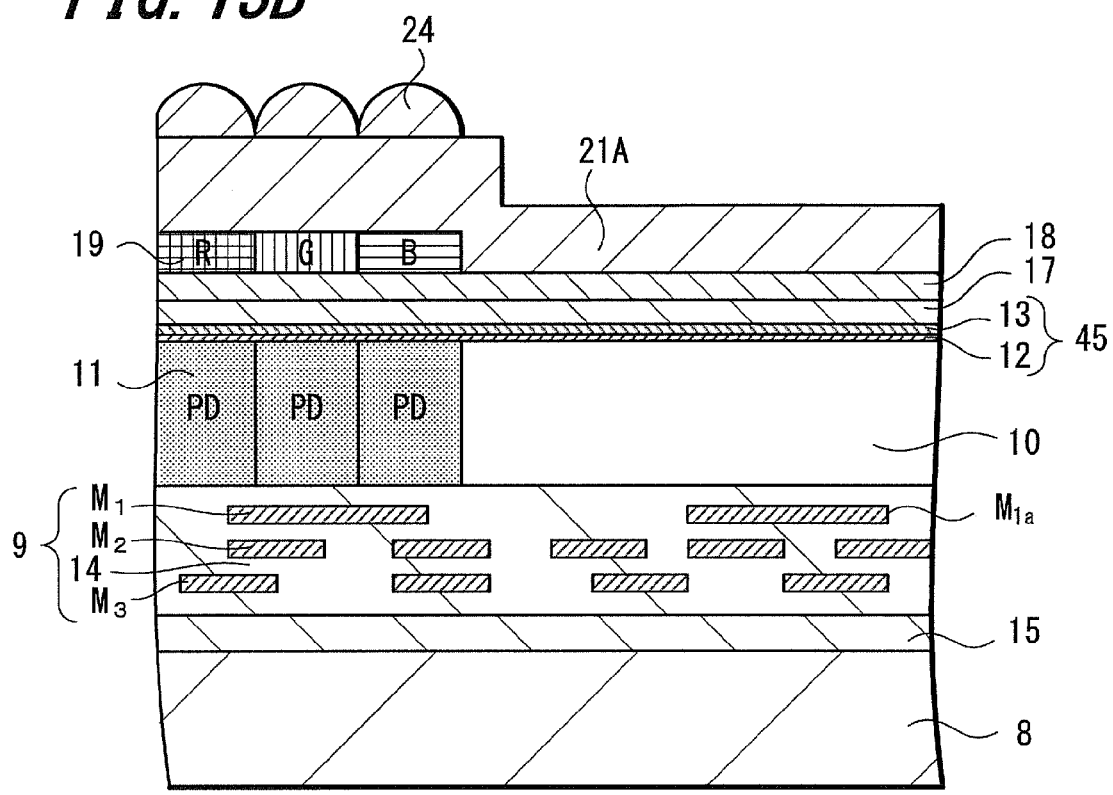

Next, as shown in FIG. 13B, a lens-shaped member 24 with a desired curvature, which corresponds to an on-chip lens for each of the pixels, is formed on the on-chip microlens member 21A, that is, above the corresponding on-chip color filter 19. The lens-shaped member 24 is formed using a positive resist film. That is, the positive resist film is applied and then subjected to patterning for each of the pixels, followed by a reflow process.

Figure 14C:
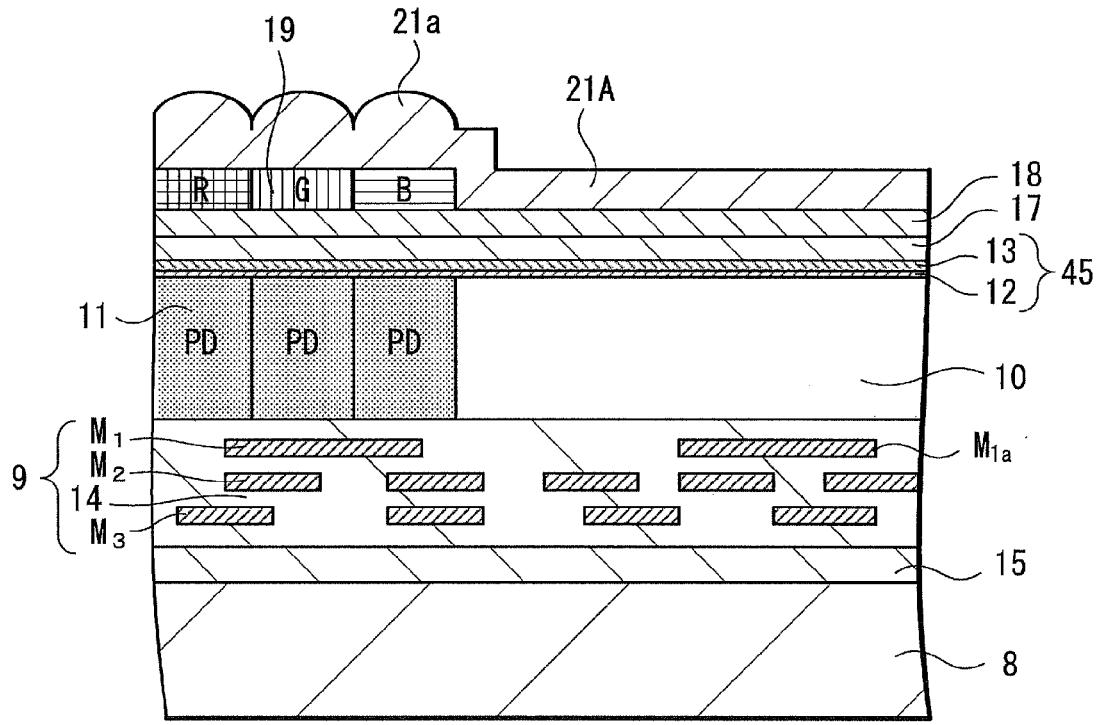
FIGS. 14C and 14D are schematic diagrams (Part II) illustrating the second example method of manufacturing the solid-state imaging device according to an embodiment of the present invention, where

Next, as shown in FIG. 14C, a whole-surface etch-back process is carried out on the whole area. In the process, the lens shape of the lens-shaped member 24 is transferred to the on-chip microlens member 21A. The transfer process makes a primary on-chip microlens 21a but not the final on-chip microlens 21. Through the process, the surface of the transferred primary on-chip microlens 21a and the surface of the other portion of the on-chip microlens member 21A are hardened.

Figure 14D:
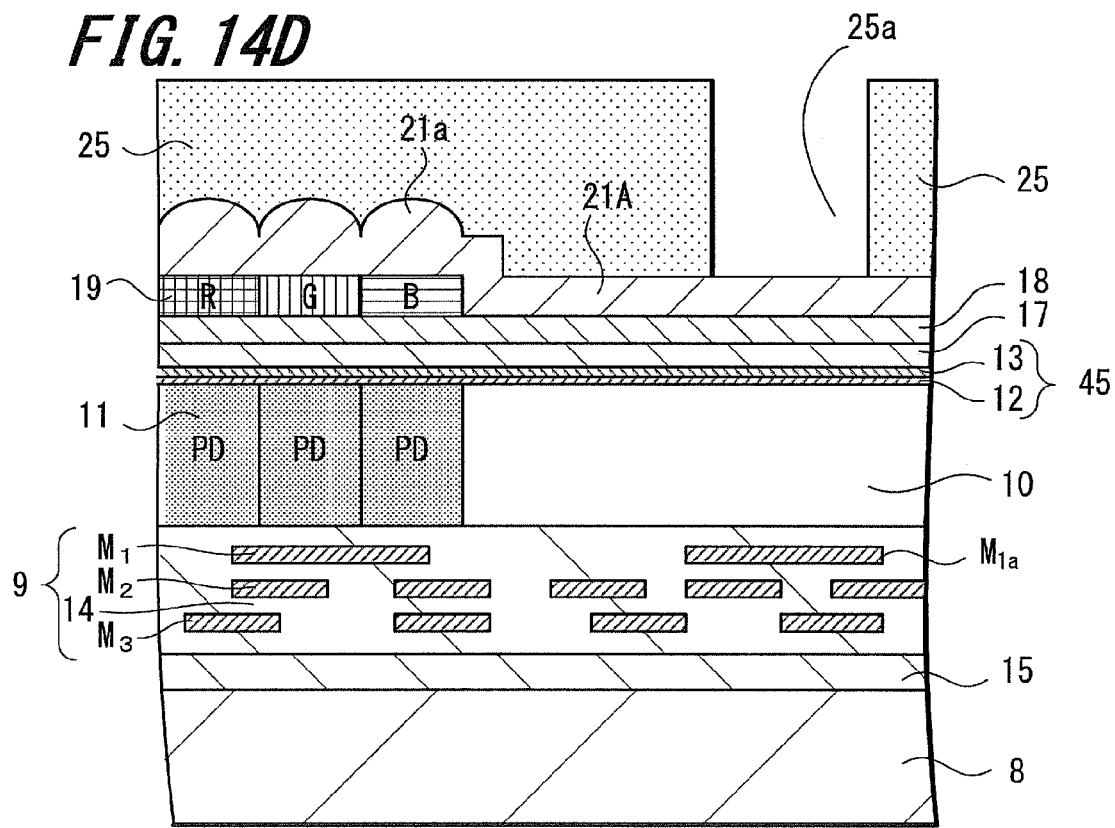

Next, as shown in FIG. 14D, a resist mask 25 having an opening 25a at a position where a pad part is formed is formed over the primary on-chip microlens 21a and the on-chip microlens member 21A. Similar to the example described above, the resist mask 25 used in this example may be any of those typically used in the known semiconductor process.

Figure 15E:
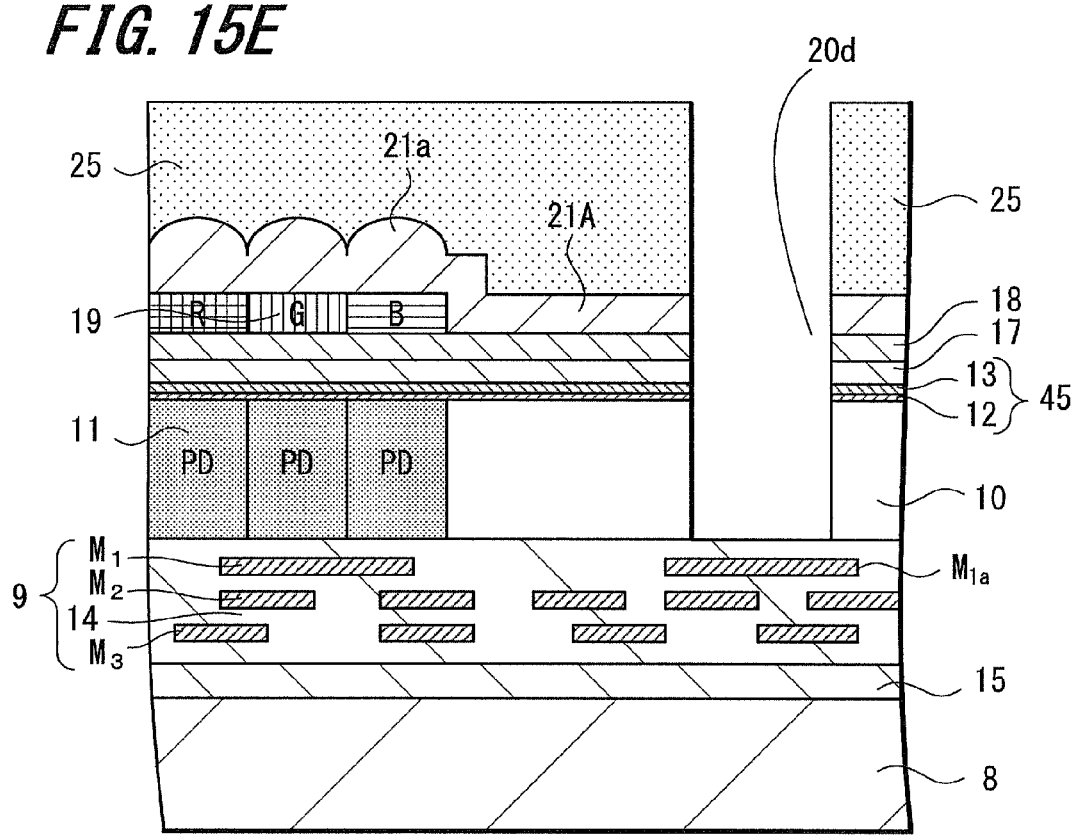
FIGS. 15E and 15F are schematic diagrams (Part III) illustrating the second example method of manufacturing the solid-state imaging device according to an embodiment of the present invention, where

Next, as shown in FIG. 15E, dry etching is carried out from the surface of the on-chip microlens member 21A to the entire silicon semiconductor layer 10 through the resist mask 25 to form a primary opening 20d. In this case, the dry etching is carried out using different etching gases for etching the on-chip microlens member 21A, etching the planarizing film 18, passivation layer 17, and antireflective coating 45, and etching the silicon semiconductor layer 10.

Figure 15F:
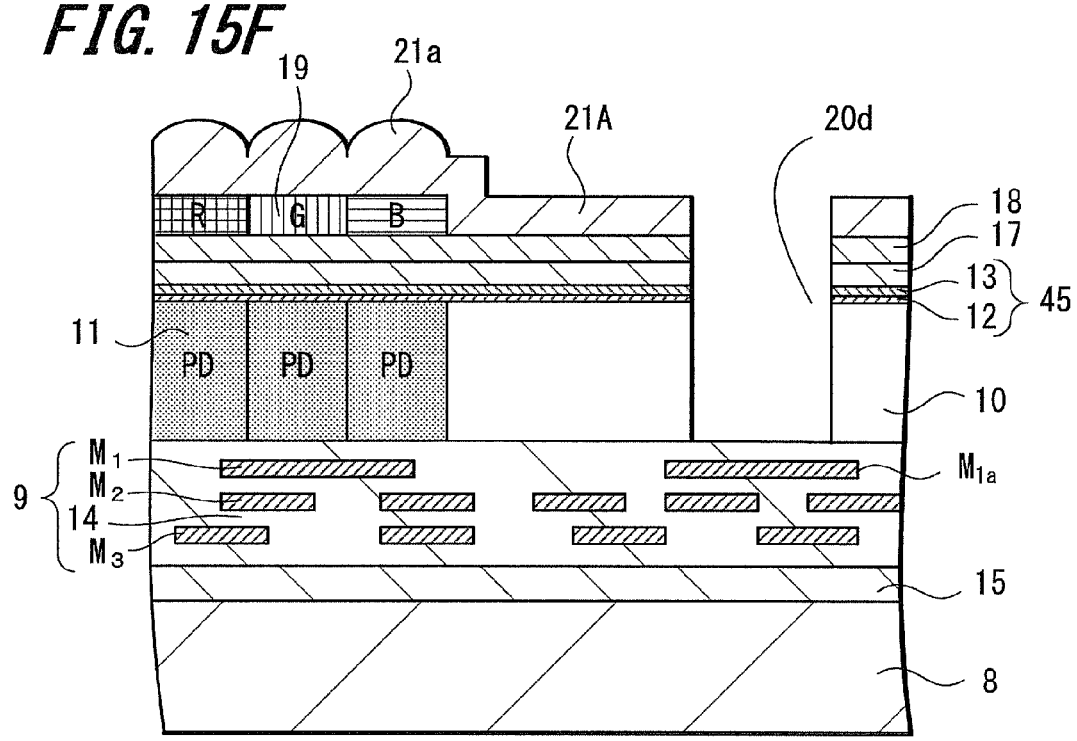

Next, as shown in FIG. 15F, the resist mask 25 is stripped and removed using an organic solvent, such as thinner, or a combination of an ashing process and an organic solvent, such as thinner. In the previous step, the silicon semiconductor layer 10 is etched, but the Al wiring M1a is not exposed. Thus, the generation of an undesired reaction product can be prevented or the generation of an undesired product can be suppressed as much as possible. Accordingly, adhesion of the undesired reaction product to the surface of the resist mask can be decreased extremely. Therefore, only the resist mask 25 can be readily stripped and removed using an organic solvent, such as thinner, or a combination of an ashing process and an organic solvent, such as thinner without causing any abnormality to the primary on-chip microlens 21a.

Figure 16:
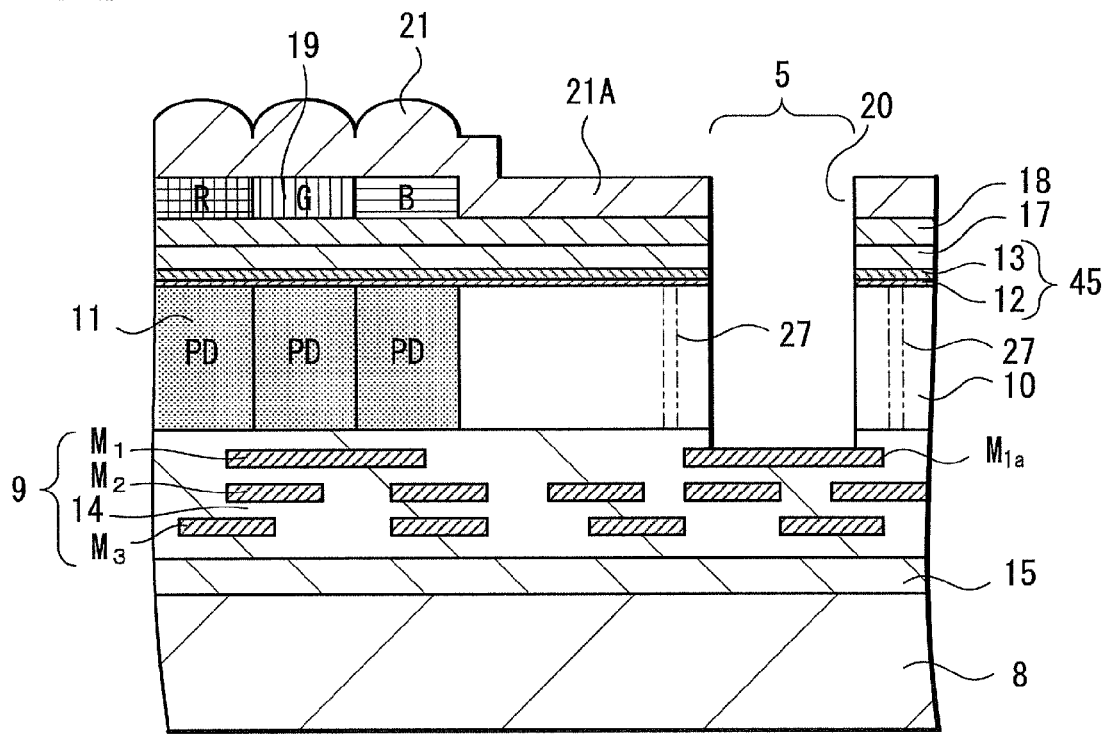
FIG. 16 is a schematic diagram (Part IV) illustrating the second example method of manufacturing the solid-state imaging device according to an embodiment of the present invention.

Next, as shown in FIG. 16, the final on-chip microlens 21 is formed by carrying out a second whole-surface etch-back process under the same conditions as those of the first one for the formation of the primary on-chip microlens 21. In the etch-back process, simultaneously, the insulating interlayer 14 located between the silicon semiconductor 10 and the Al wiring M1a for wire bonding is removed by etch-back, forming the final opening 20 where the Al wiring is exposed. A desired pad part 5 can be formed as a result of the formation of such an opening 20.

In addition, an insulating isolation layer 27 is formed in advance in part of the silicon semiconductor layer 10, which corresponds to the circumference of the opening 20. Therefore, when a bonding wire, such as an Au wire, is bonded in the opening 20, the bonding wire can be prevented from being electrically short-circuited to the other part of the silicon semiconductor layer 10.

According to the second example, the method of manufacturing the solid-state imaging device and the method of manufacturing the electronic apparatus using such a device includes the step of applying the organic film such as the resist film for forming an on-chip color filter and an on-chip microlens to the surface of the substrate (or base surface) substantially without any stepped portion before the formation of the opening 20 in the pad part 5. In the course of such a resist application work, since the base surface may not have any stepped portion, the resist film can be prevented from generating any striation due to the stepped portion in the opening of the pad part. By preventing a striation, both the on-chip color filter 19 and the on-chip microlens 21 can be formed uniformly. Thus, a solid-state imaging device with high reliability without inconsistent imaging characteristics and an electronic apparatus having such a device can be manufactured.

In addition, in selective etching through the resist mask 25, dry etching is carried out from the on-chip microlens member 21A on the surface to the silicon semiconductor layer 10 without exposure of Al wiring M1a, forming the primary opening 20d. Therefore, it is possible to prevent the generation of an undesired reaction product and increase the removability of the resist mask 25. Furthermore, both the surface of the primary on-chip microlens 21a and the surface of the on-chip microlens member 21A are hardened by the etch-back process, so that only the resist mask 25 can be readily stripped and removed. In other words, only a resist mask can be stripped and removed, without any affect to the primary on-chip microlens 21a.

In addition, the second whole surface etch-back process forms the final on-chip microlens 21 while exposing the Al wiring M1a on the pad part 5. Thus, the etching amount of the Al wiring M1a can be reduced.

The solid-state imaging device having the characteristic features as described above can be employed as an imaging device in an electronic apparatus, such as a digital camera or a camcorder.

Figure 17:
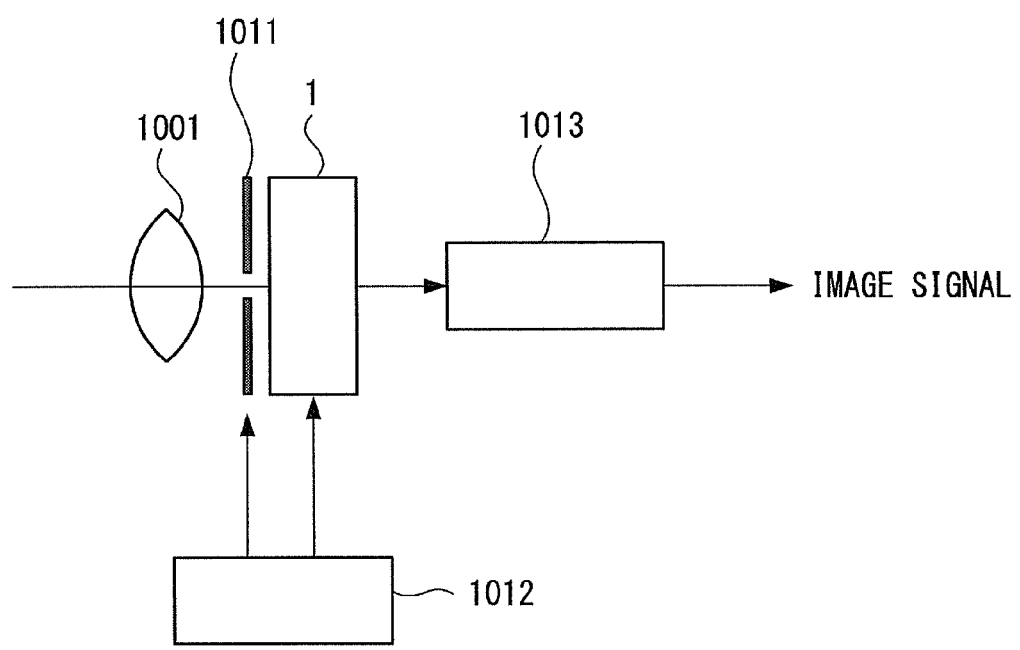
FIG. 17 is a schematic diagram illustrating the configuration of an electronic apparatus according to an embodiment of the present invention.

FIG. 17 is a diagram illustrating an example configuration of an electronic apparatus including the solid-state imaging device according to an embodiment of the present invention.

As shown in FIG. 17, the electronic apparatus includes the solid-state imaging device 1 according to an embodiment as an imaging device, an optical system for introducing incident light into the pixel region of the imaging device (forming an object image), such as a lens 1001 for focusing incident light (image light) on an imaging surface, an optical diaphragm 1011, a drive circuit (DRV) 1012 for driving the imaging device, and a signal-processing circuit (PRC) 1013 for processing a signal output from the imaging device.

The drive circuit 1012 includes a timing generator (not shown) that generates various kinds of timing signals, such as a start pulse and a clock pulse for driving circuits in the imaging device. Thus, the drive circuit 1012 drives the imaging device with a predetermined timing signal.

In addition, the signal processing circuit 1013 performs signal processing such as CDS (Correlated Double Sampling) and ADC (Analog to Digital Conversion) on signals output from the imaging device.

Image signals processed by the signal processing circuit 1013 are stored in a recording medium such as a memory. The image data stored in the recording medium can be output in hard copy by a printer or the like. Furthermore, image signals processed by the signal processing circuit 1013 can be projected as video on a monitor such as a liquid crystal display.

As described above, a high-precision camera can be realized by mounting the aforementioned solid-state imaging device 1 as an imaging device to an imaging apparatus, such as a digital still camera.

This invention is not limited to the above embodiments.

For instance, numerical values and materials which have been mentioned in the above embodiments are only provided for illustrative purposes and not intend to be limited by them. Further, they can be variously modified without departing from the gist of the invention.

The present application contains subject matter related to that disclosed in Japanese Priority Patent Application JP 2008-125189 filed in the Japan Patent Office on May 12, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a solid-state imaging device, where a signal circuit is formed on an insulating interlayer on a first side of a semiconductor substrate in which a photoelectric conversion part is formed and light is incident on the photoelectric conversion part from a second side thereof, the method comprising the steps of:

forming an on-chip color filter and an on-chip microlens on the second side where light is incident; and forming a primary opening in a pad part on the second side where light is incident, after forming the on-chip color filter and the on-chip microlens forming a secondary opening by selectively dry etching and removing the semiconductor substrate from the surface of the semiconductor substrate to reach an upper surface of the insulating interlayer at a portion corresponding to the opening through a resist mask formed on the on-chip microlens.

2. The method of manufacturing a solid-state imaging device according to claim 1, wherein the on-chip color filter and the on-chip microlens are formed by application of organic films, respectively.

3. The method of manufacturing a solid-state imaging device according to claim 2, wherein the step of forming the on-chip microlens further includes the steps of:

forming an on-chip microlens member, which is made of an organic film with an opening in a portion where the pad part is formed, on the surface where the on-chip color filter is formed;

forming a lens-shaped member on a part of the on-chip microlens member;

etching back a whole-surface to transfer a primary on-chip microlens to the on-chip microlens member and simultaneously etching from a top surface to a depth into the semiconductor substrate through the opening of the on-chip microlens member to form the opening.

4. The method of manufacturing a solid-state imaging device according to claim 2, further comprising the step of:
removing the resist mask using an organic solvent or a combination of an ashing process and an organic solvent.

5. The method of manufacturing a solid-state imaging device according to claim 4, further comprising the steps of:
forming a final on-chip microlens by etching back the whole surface after removing the resist mask; and
simultaneously removing the insulating interlayer at the bottom of the primary opening to form a final opening that exposes the signal circuit wire bonded.

6. The method of manufacturing the solid-state imaging device according to claim 1, further comprising the step of removing the resist mask after forming the secondary opening.

7. The method of manufacturing a solid-state imaging device according to claim 6, further comprising the steps of:
forming a final on-chip microlens by etching back the whole surface after removing the resist mask, and
simultaneously removing the insulating interlayer at the bottom of the secondary opening to form a final opening that exposes the signal circuit wire-bonded.

8. The method of manufacturing a solid-state imaging device according to claim 7, wherein
the semiconductor substrate in the primary opening is etched using a gas mixture of $SF_6$ and $O_2$, and the resist mask is removed using an organic solvent or a combination of an ashing process and an organic solvent.

9. A method of manufacturing an electronic apparatus, where a signal circuit is formed on an insulating interlayer on a first side of a semiconductor substrate on which a photoelectric conversion part is formed and light is incident on the photoelectric conversion part from a second side thereof, the method comprising the steps of:
forming an on-chip color filter and an on-chip microlens on the second side where light is incident;
forming an opening in a pad part on the second side where light is incident, after forming the on-chip color filter and the on-chip microlens; and
selectively dry etching and removing the semiconductor substrate from the surface of the semiconductor substrate to reach an upper surface of the insulating interlayer at a portion corresponding to the opening through a resist mask formed on the on-chip microlens.

* * * * *